United States Patent [19]
Asada et al.

[11] Patent Number: 5,959,709
[45] Date of Patent: Sep. 28, 1999

[54] DISPLAY UNIT WITH FLEXIBLE PRINTED CIRCUIT BOARD

[75] Inventors: Hideki Asada; Hideki Kaneko, both of Tokyo, Japan

[73] Assignee: NEC Corporation, Tokyo, Japan

[21] Appl. No.: 09/199,391

[22] Filed: Nov. 25, 1998

Related U.S. Application Data

[62] Division of application No. 09/129,540, Aug. 5, 1998.

[30] Foreign Application Priority Data

Aug. 11, 1997 [JP] Japan ................................ 9-216404

[51] Int. Cl.$^6$ .................................................. G02F 1/1345
[52] U.S. Cl. ................................................... 349/150
[58] Field of Search ................................. 349/149, 150, 349/152

[56] References Cited

U.S. PATENT DOCUMENTS 5,668,700  9/1997  Tagusa et al. ........................ 349/150

FOREIGN PATENT DOCUMENTS

A 6-85004  3/1994  Japan .
A 6152192  5/1994  Japan .

Primary Examiner—William L. Sikes
Assistant Examiner—James Dudek
Attorney, Agent, or Firm—Sughrue, Mion, Zinn, Macpeak & Seas, PLLC

[57] ABSTRACT

A display unit has a peripheral driver circuit mounted on a flat display substrate. The flat display substrate has on a surface thereof a plurality of scanning lines, a plurality of signal lines perpendicular to the scanning lines, and an input electrode connected to each of the scanning lines or the signal lines. The peripheral driver circuit has on a surface thereof a peripheral driver circuit for energizing the scanning lines or the signal lines, and input and output electrodes electrically connected to the peripheral driver circuit. The display unit also includes a driver circuit board having on a surface thereof a driver circuit for supplying a power supply voltage and transmitting a control signal to the peripheral driver circuit on the peripheral driver circuit substrate, and an output electrode electrically connected to the driver circuit. The input electrode of each of the scanning lines or the signal lines is electrically connected to the output electrode on the peripheral driver circuit substrate by a flexible printed circuit board. The input electrode on the peripheral driver circuit substrate is also electrically connected to the output electrode on the driver circuit board by the flexible printed circuit board. Since the electrodes on the boards are electrically connected by the flexible printed circuit board, it is not necessary to form bumps on the input and output electrodes of the peripheral driver circuit substrate.

16 Claims, 14 Drawing Sheets

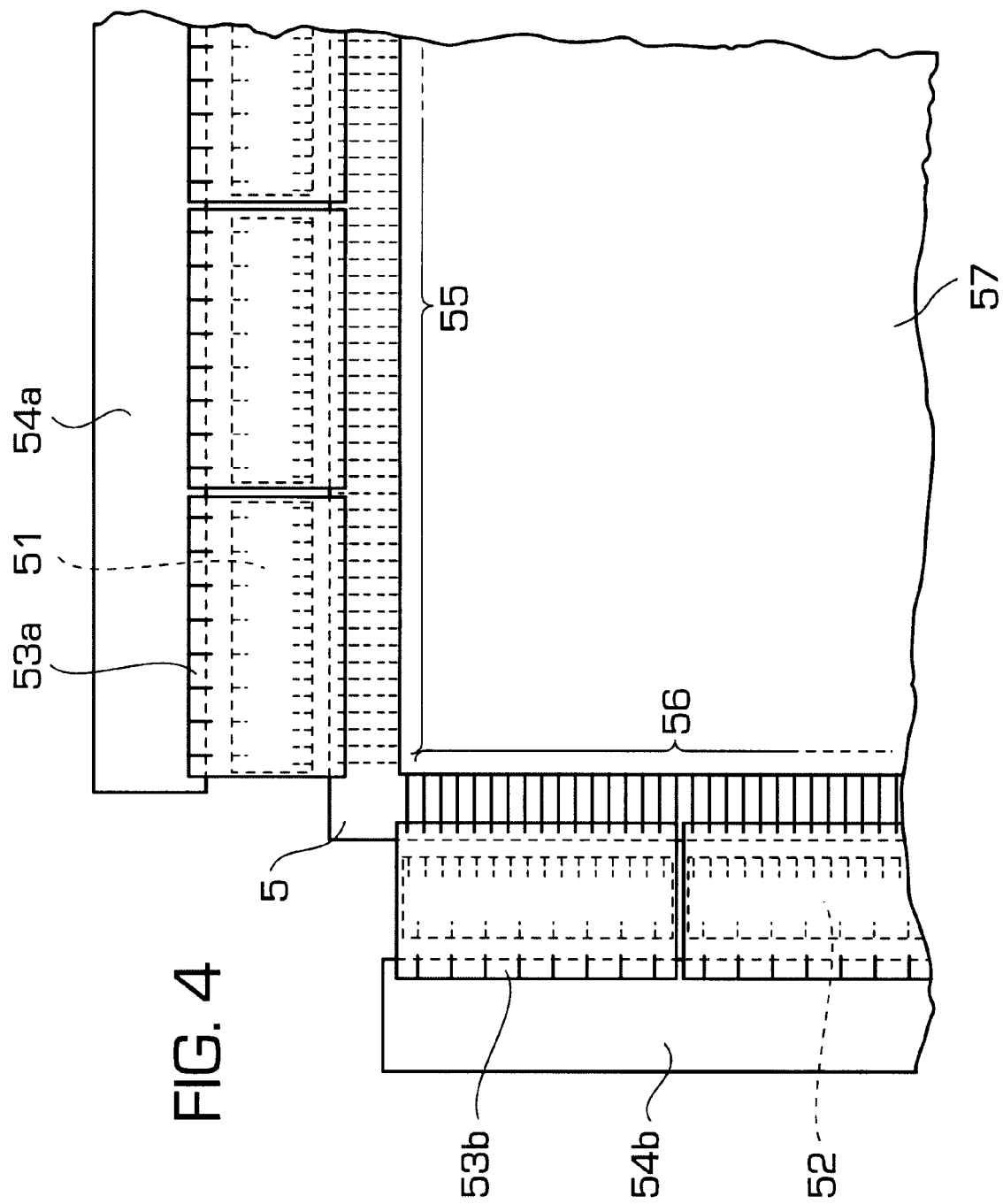

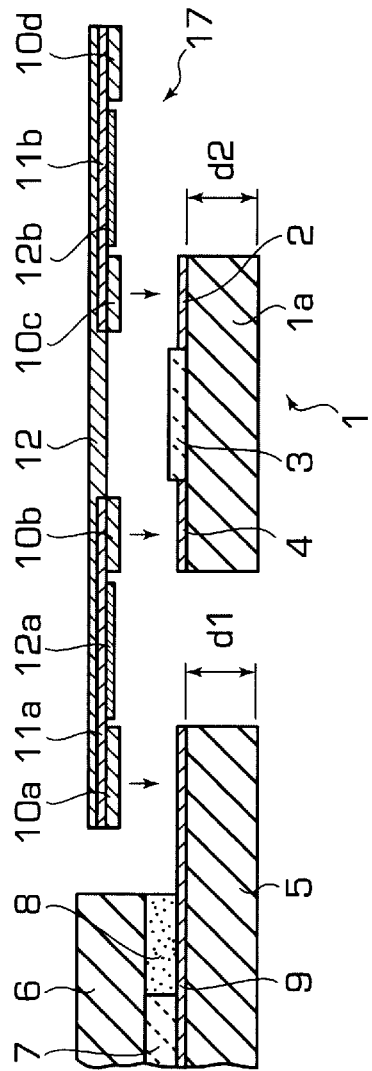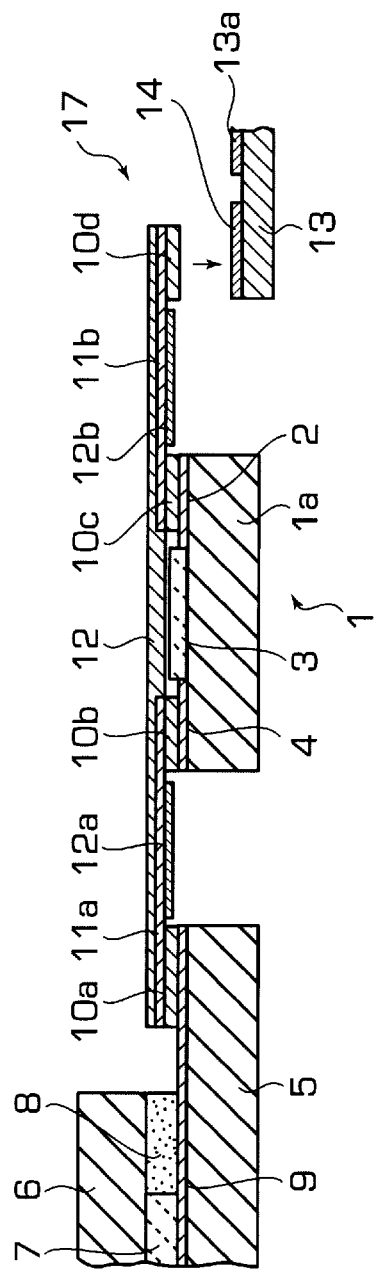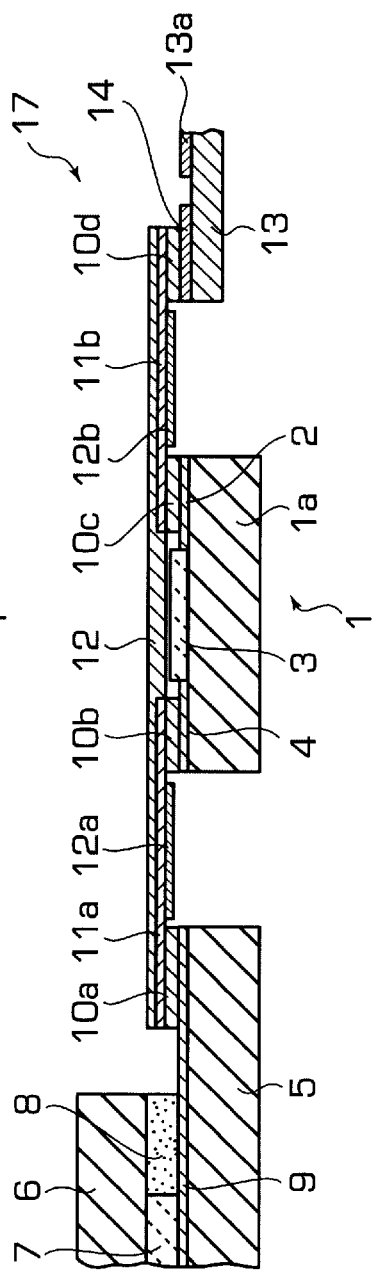

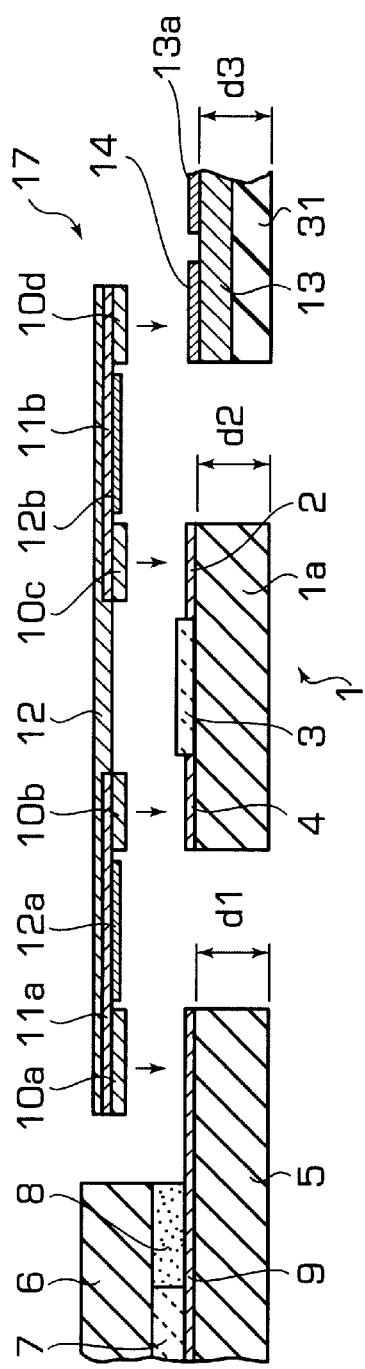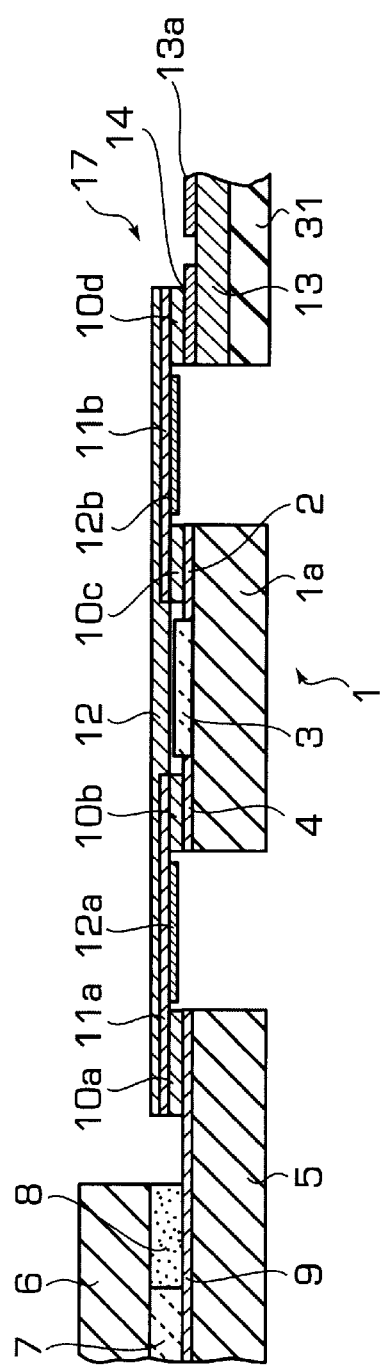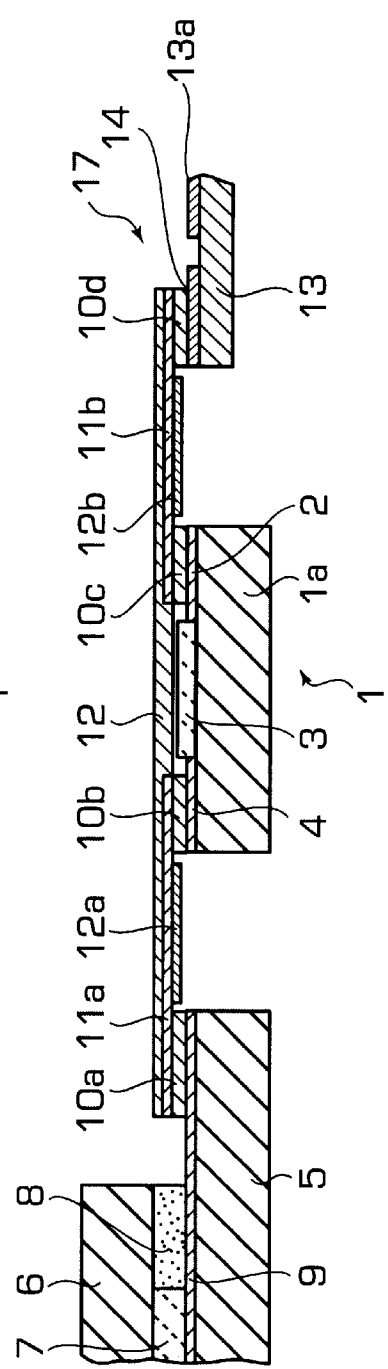

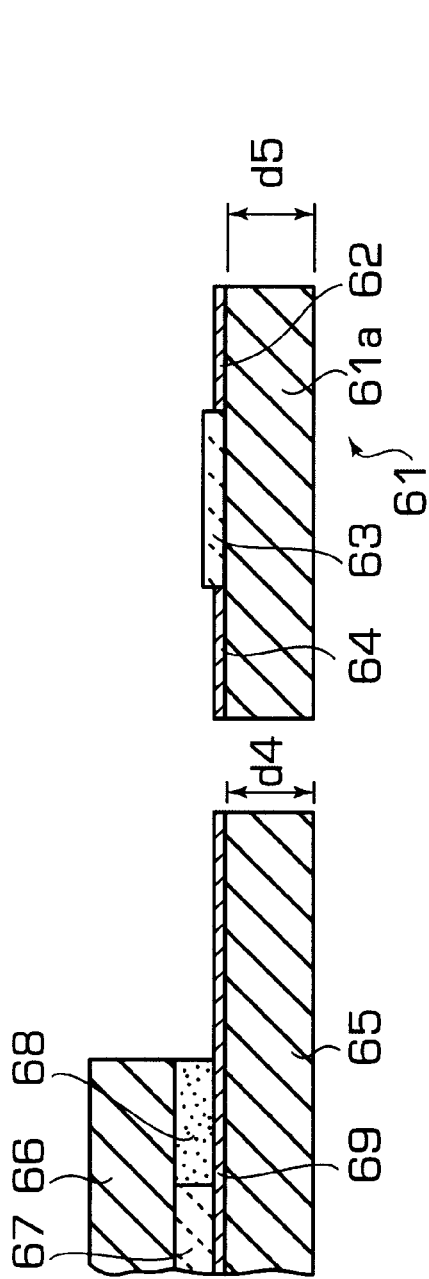
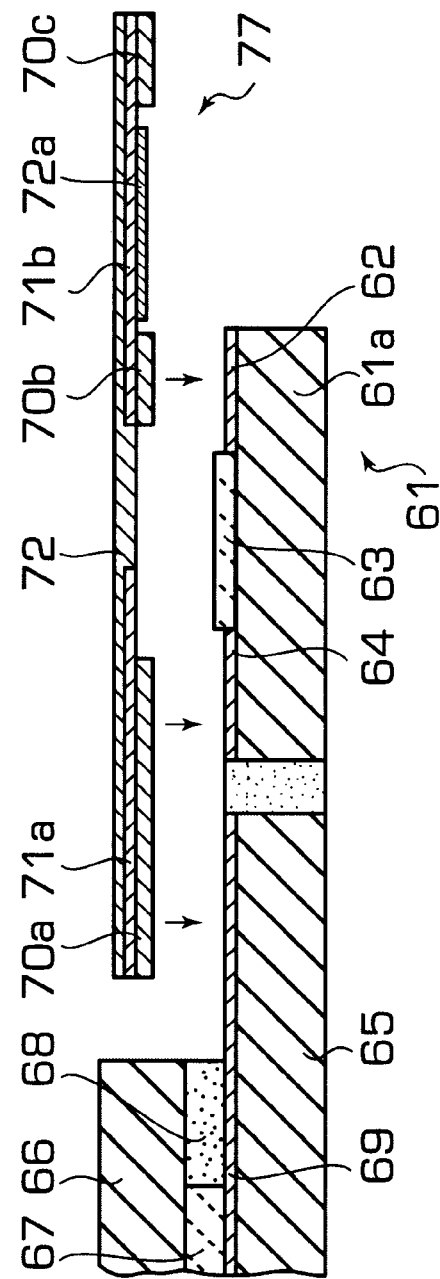
FIG. 9A
FIG. 9B

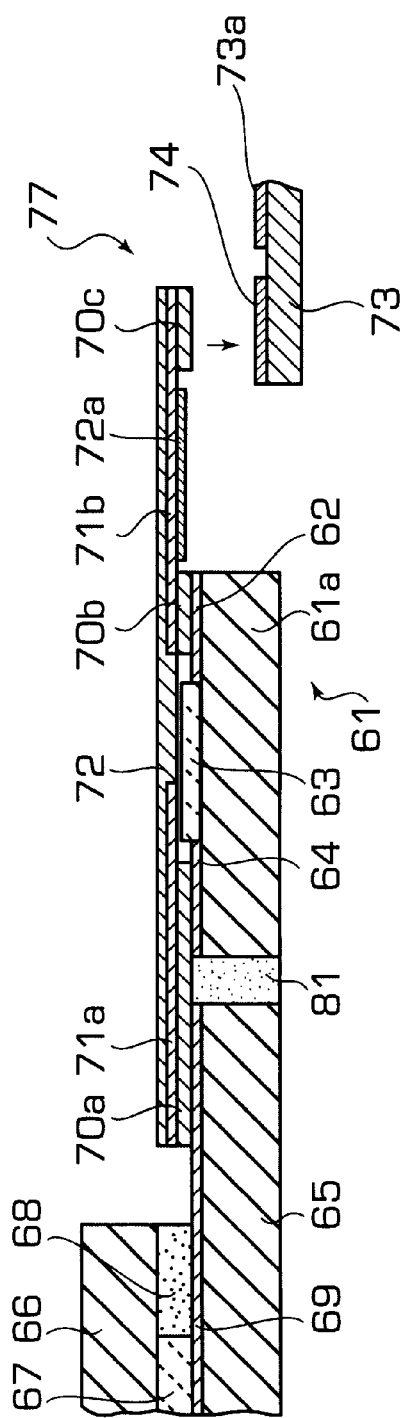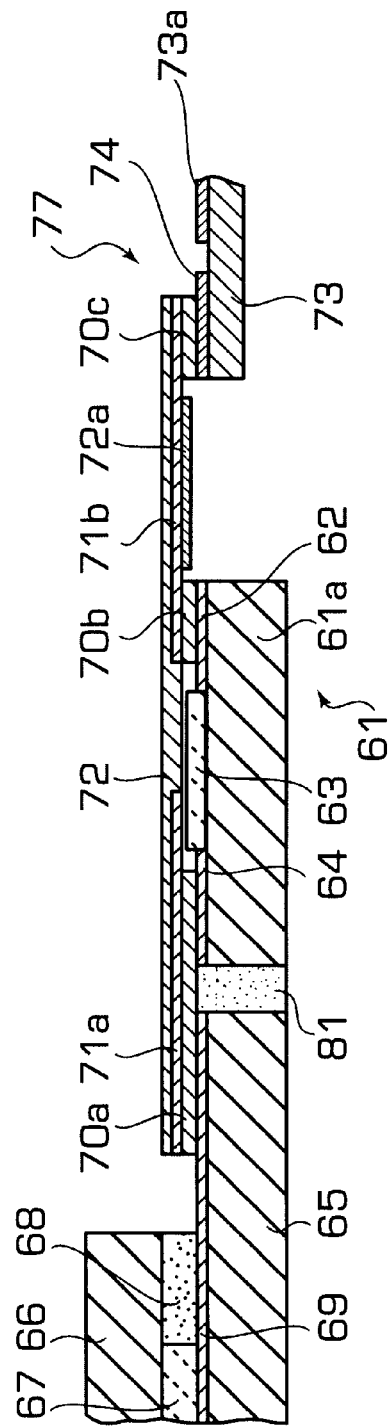

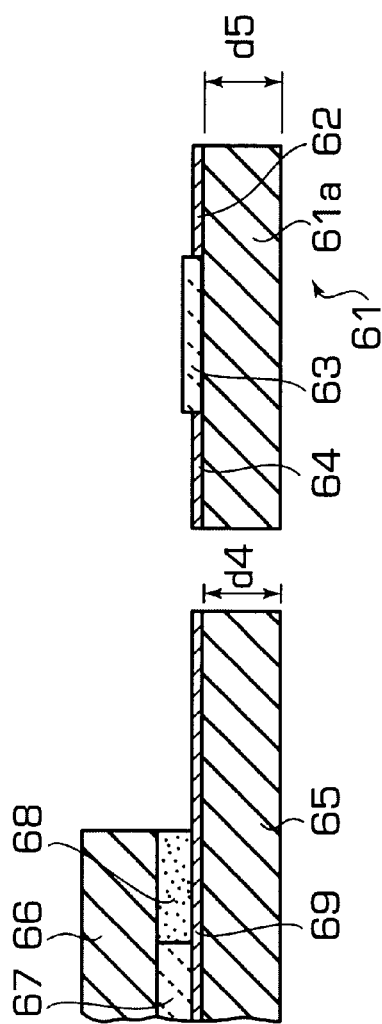
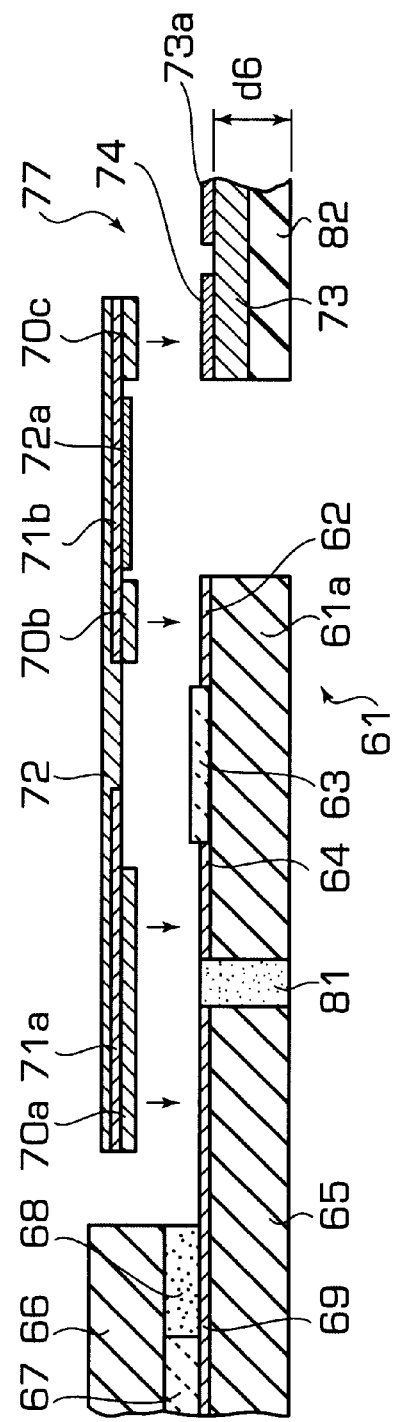
FIG. 10A
FIG. 10B

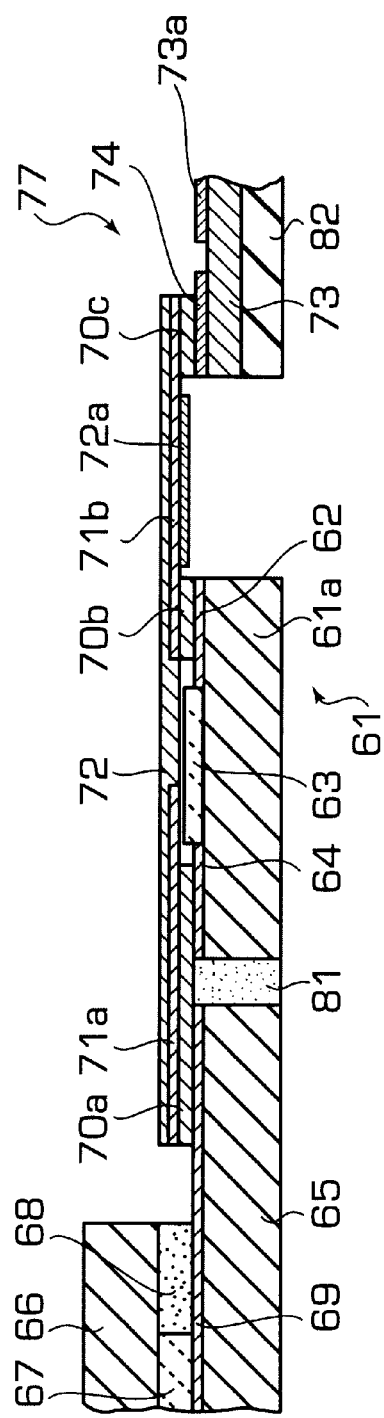
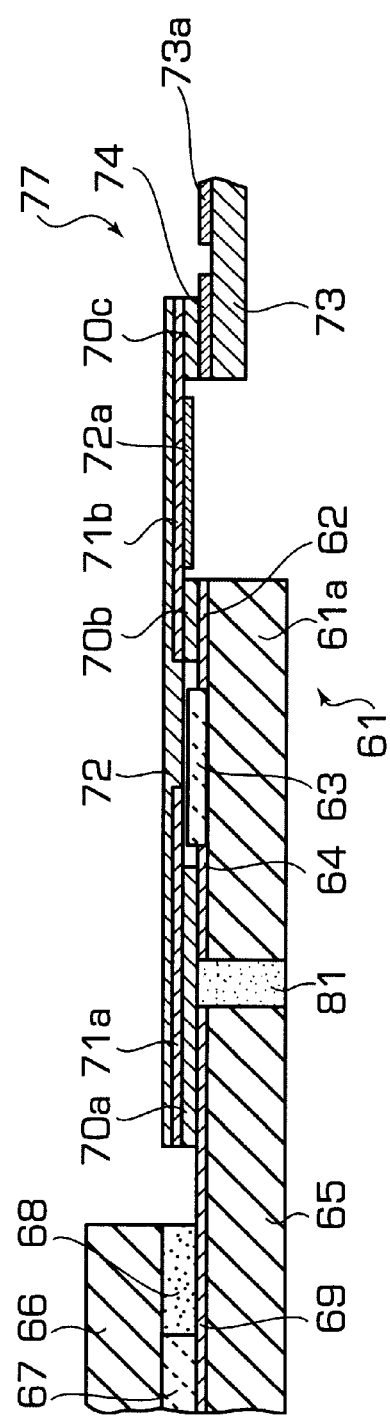
FIG. 10C
FIG. 10D

DISPLAY UNIT WITH FLEXIBLE PRINTED CIRCUIT BOARD

This is a divisional of application Ser. No. 09/129,540 filed Aug. 5, 1998, the disclosure of which is incorporated herein by reference.

BACKGROUND OF THE INVENTION

1. Field of the Invention

The present invention relates to a display unit comprising a flat display substrate which has pixels disposed at points of intersection between scanning lines and signal lines, and a peripheral driver circuit substrate mounted on the flat display substrate, and a method of manufacturing such a display unit.

2. Description of the Related Art

Conventional liquid crystal display units have driver IC chips which have typically been p-SiTFT driver IC chips each comprising polycrystalline silicon thin-film transistors (hereinafter referred to as "p-SiTFT") disposed on a surface of a glass substrate. Liquid crystal display units with such p-SiTFT driver IC chips are disclosed in Japanese Patent Laid-open patent publication No. 88971/94 and Japanese Patent Laid-open patent publication No. 333645/95.

As shown in FIG. 1 of the accompanying drawings, a conventional liquid crystal display unit with p-SiTFT driver IC chips has a display area 157 on a surface of a liquid crystal display substrate 101 which is a flat display substrate. The display area 157 comprises a plurality of gate bus lines 156 as horizontal scanning lines and a plurality of data bus lines 155 as vertical signal lines. Source driver IC glass chips 102 and gate driver IC glass chips 103 are directly mounted on another area of the surface of the liquid crystal display substrate 101 than the display area 157. These driver IC glass chips 102 are mounted on the liquid crystal display substrate 101 by the COG (Chip-On-Glass) technique. The source driver IC glass chips 102 are electrically connected to the data bus lines 155, and the gate driver IC glass chips 103 are electrically connected to the gate bus lines 156.

Each of the gate driver IC glass chips 103 comprises a peripheral driver circuit (not shown) for driving gate bus lines 156 and a peripheral driver circuit substrate (not shown) on which the peripheral driver circuit is mounted. There are four gate driver IC glass chips 103 arranged in a vertical array. Each of source driver IC glass chips 102 comprises a peripheral driver circuit (not shown) for driving data bus lines 155 and a peripheral driver circuit substrate (not shown) on which the peripheral driver circuit is mounted. There are ten source driver IC glass chips 102 arrayed in a horizontal row.

p-SiTFT driver IC chips are usually disposed in a closely spaced pattern on a surface of a glass substrate which is used as a liquid crystal display substrate. Therefore, the driver IC chips and the liquid crystal display substrate have equal or close coefficients of thermal expansion. Even with the driver IC glass chips mounted on the liquid crystal display substrate by the COG technique, junctions of electrodes of the driver IC glass chips are free from disconnections due to different thermal stresses in the driver IC glass chips and the liquid crystal display substrate. As a result, highly reliable liquid crystal display units can be manufactured with a high yield.

If single-silicon driver IC glass chips are mounted on a liquid crystal display substrate by the COG technique, then junctions of electrodes of the driver IC glass chips tend to be disconnected because of different coefficients of thermal expansion of the driver IC glass chips and the liquid crystal display substrate.

For mounting p-SiTFT driver IC chips on a liquid crystal display substrate, therefore, the COG technique has been used taking the advantage of the same coefficients of thermal expansion of the p-SiTFT driver IC glass chips and the liquid crystal display substrate.

As shown in FIG. 2 of the accompanying drawings, a conventional liquid crystal display unit has a liquid crystal display substrate 111 as a flat display substrate and an opposite substrate 123 which are joined to each other by a seal 124 interposed therebetween. A liquid crystal 125 is sealed between the liquid crystal display substrate 111 and the opposite substrate 123. The liquid crystal display unit also includes a plurality of scanning lines and a plurality of signal lines extending perpendicular across the scanning lines, the scanning lines and the signal lines being disposed on a surface of the liquid crystal display substrate 111 which faces the opposite substrate 123.

A driver IC glass chip 112 comprises a glass substrate 112a as a peripheral driver circuit substrate, a driver IC 114 as a peripheral driver circuit, a driver IC input electrode 113, and a driver IC output electrode 115. The driver IC 114, the driver IC input electrode 113, and the driver IC output electrode 115 are disposed on a surface of the glass substrate 112a. The driver IC input electrode 113 and the driver IC output electrode 115 are electrically connected to the driver IC 114.

An input electrode 122 of a scanning line or a signal line is disposed on a surface of the liquid crystal display substrate 111 which faces the liquid crystal 125, and extends from a display area where the liquid crystal 125 is sealed. An interconnection electrode 121 is also disposed on the surface of the liquid crystal display substrate 111 which faces the liquid crystal 125. The driver IC input electrode 113 of the driver IC glass chip 112 is electrically connected to a flexible printed circuit board 132 by the interconnection electrode 121.

For mounting the driver IC glass chip 112 on the liquid crystal display substrate 111 by the COG technique, a bump 116a is formed on the surface of the driver IC input electrode 113, and a bump 116b is formed on the surface of the driver IC output electrode 115. A surface of the driver IC glass chip 112 which faces the driver IC 114 is then mounted on the liquid crystal display substrate 111 by the face down bonding. The bump 116a is bonded to the interconnection electrode 121, electrically connecting the driver IC input electrode 113 to the interconnection electrode 121 through the bump 116a. The bump 116b is bonded to the input electrode 122, electrically connecting the driver IC output electrode 115 to the input electrode 122 through the bump 116b. Thereafter, a protective resin body 117 is formed around the junctions between the driver IC glass chip 112 on the liquid crystal display substrate 111 and also around the driver IC 114. In this manner, the driver IC glass chip 112 is secured in position and protected by the protective resin body 117.

The flexible printed circuit board 132 comprises an insulating film 120, a conductor 119, and an insulating film 120a. The conductor 119 is disposed on a surface of the insulating film 120, and the insulating film 120a is disposed on an area of a surface of the conductor 119 other than an area thereof reserved for electrical connection. The area of the conductor 119 reserved for electrical connection, i.e., an end of the conductor 119, is pressed and bonded to the interconnection electrode 121 through an anisotropic conductive film 118.

The conductor 119 is thus electrically connected to the interconnection electrode 121 by the anisotropic conductive film 118.

The conductor 119 has an opposite end electrically connected to an output electrode of a driver circuit on a driver circuit board (not shown), which serves to supply a power supply voltage and transmits a control signal to the driver IC 114. Therefore, the output electrode of the driver circuit on the driver circuit board and the driver IC input electrode 113 are electrically connected to each other by the conductor 119, the anisotropic conductive film 118, the interconnection electrode 121, and the bump 116a.

In the conventional liquid crystal display unit shown in FIG. 2, the driver IC glass chip 112 is mounted on the liquid crystal display substrate 111 by the COG technique. According to the COG mounting process, the bumps 116a, 116b need to be formed respectively on the driver IC input electrode 113 and the driver IC output electrode 115 of the driver IC glass chip 112. The need to form these bumps 116a, 116b is responsible for limitations posed on efforts to lower the cost of the liquid crystal display unit.

A packaging technique known as TCP (Tape Carrier Package) which has widely been used for mounting single-crystal silicon driver IC chips on liquid crystal display substrates is applied in some instances to the mounting of TFT driver IC chips. The TCP technique also requires a bump forming process, a bonding process, and a resin sealing process. Accordingly, the TCP technique as applied to the mounting of TFT driver IC chips has prevented liquid crystal display units from being lowered in cost.

SUMMARY OF THE INVENTION

It is an object of the present invention to provide a display unit which comprises a flat display substrate and a peripheral driver circuit substrate having a peripheral driver circuit and mounted on the flat display substrate through a simple process without the need for bumps on the peripheral driver circuit substrate, and a method of manufacturing such a display unit.

To achieve the above object, an input electrode of each of scanning lines or signal lines on a flat display substrate is electrically connected by a flexible printed circuit board to an output electrode on a peripheral driver circuit substrate having a peripheral driver circuit for energizing the scanning lines or the signal lines. An input electrode on the peripheral driver circuit substrate is electrically connected by the flexible printed circuit board to an output electrode on a driver circuit board having a driver circuit for supplying a power supply voltage and transmitting a control signal to the peripheral driver circuit. It is, therefore, not necessary to form bumps on the input and output electrodes of the peripheral driver circuit substrate, and the display unit may be manufactured inexpensively and with a high yield.

The peripheral driver circuit substrate may be positioned on a side of the flat display substrate to reduce the area of any other portion of the display unit than a display area thereof, compared with a display unit in which the peripheral driver circuit substrate is positioned on the surface of the display area thereof.

A side of the peripheral driver circuit substrate may be bonded to a side of the flat display substrate to align the flat display substrate, the peripheral driver circuit substrate, and the flexible printed circuit board positionally with each other highly accurately. This arrangement also allows the input electrode of each of the scanning lines or signal lines and the input and output electrodes of the peripheral driver circuit substrate to be connected to the flexible printed circuit board highly efficiently.

Furthermore, a plurality of peripheral driver circuit substrates may be connected to a flat display unit by respective flexible printed circuit boards associated respectively with the peripheral driver circuit substrates. When the peripheral driver circuit substrates are connected to the flat display unit by the respective flexible printed circuit boards, the peripheral driver circuit substrates can positionally be aligned with the flat display unit highly accurately.

According to a method of manufacturing a display unit, an input electrode of each of scanning lines or signal lines on a flat display substrate is electrically connected by a flexible printed circuit board to an output electrode on a peripheral driver circuit substrate, and an input electrode on the peripheral driver circuit substrate is electrically connected by the flexible printed circuit board to an output electrode on a driver circuit board. Therefore, no bumps need to be formed on the input and output electrodes of the peripheral driver circuit substrate, and the display unit may be manufactured inexpensively and with a high yield. The input electrode of each of the scanning lines or signal lines on the flat display substrate and the input and output electrodes on the peripheral driver circuit substrate are simultaneously pressed and bonded to the flexible printed circuit board. Since the electrodes are electrically connected in one process of pressing and bonding them to the flexible printed circuit board, the process of manufacturing the display unit is simplified.

If the flexible printed circuit board is joined to the output electrode of the driver circuit board by a solder, they are bonded to each other with a greater bonding strength than if they are joined by pressing and bonding them to each other.

According to another method of manufacturing a display unit, the input electrode of each of the scanning lines or signal lines on the flat display substrate, the input and output electrodes on the peripheral driver circuit substrate, and the output electrode on the driver circuit board are simultaneously pressed and bonded to the flexible printed circuit board. This method is simpler than the above method.

Furthermore, the flat display substrate and the peripheral driver circuit substrate have respective thicknesses which are equal to each other. The flat display substrate and the peripheral driver circuit substrate are placed in a plane, and the flexible printed circuit board is pressed against the flat display substrate and the peripheral driver circuit substrate. Therefore, the flexible printed circuit board can be pressed and bonded to the flat display substrate and the peripheral driver circuit substrate simultaneously.

Before the input electrode of each of the scanning lines or the signal lines and the input and output electrodes of the peripheral driver circuit substrate are pressed and bonded to the flexible printed circuit board, a side of the flat display substrate and a side of the peripheral driver circuit substrate are bonded to each other. Consequently, when the electrodes are pressed and bonded to the flexible printed circuit board, the flat display substrate and the peripheral driver circuit substrate can be aligned positionally with the flexible printed circuit board highly accurately and efficiently. As a result, the display unit can be manufactured inexpensively and with a high yield.

The above and other objects, features, and advantages of the present invention will becomes apparent from the following description with reference to the accompanying drawings which illustrate examples of the present invention.

BRIEF DESCRIPTION OF THE DRAWINGS

FIG. 4 is a fragmentary plan view, partly exploded, of the display unit shown in FIG. 3;

FIGS. 5A, 5B, and 5C are cross-sectional views illustrative of a method of manufacturing the display unit shown in FIG. 3;

FIGS. 6A, 6B, and 6C are cross-sectional views illustrative of a method of manufacturing a display unit according to a second embodiment of the present invention;

FIGS. 9A, 9B, 9C, and 9D are cross-sectional views illustrative of a method of manufacturing the display unit shown in FIG. 8;

FIGS. 10A, 10B, 10C, and 10D are cross-sectional views illustrative of a method of manufacturing a display unit according to a fifth embodiment of the present invention.

DETAILED DESCRIPTION OF THE PREFERRED EMBODIMENTS

Figure 1:
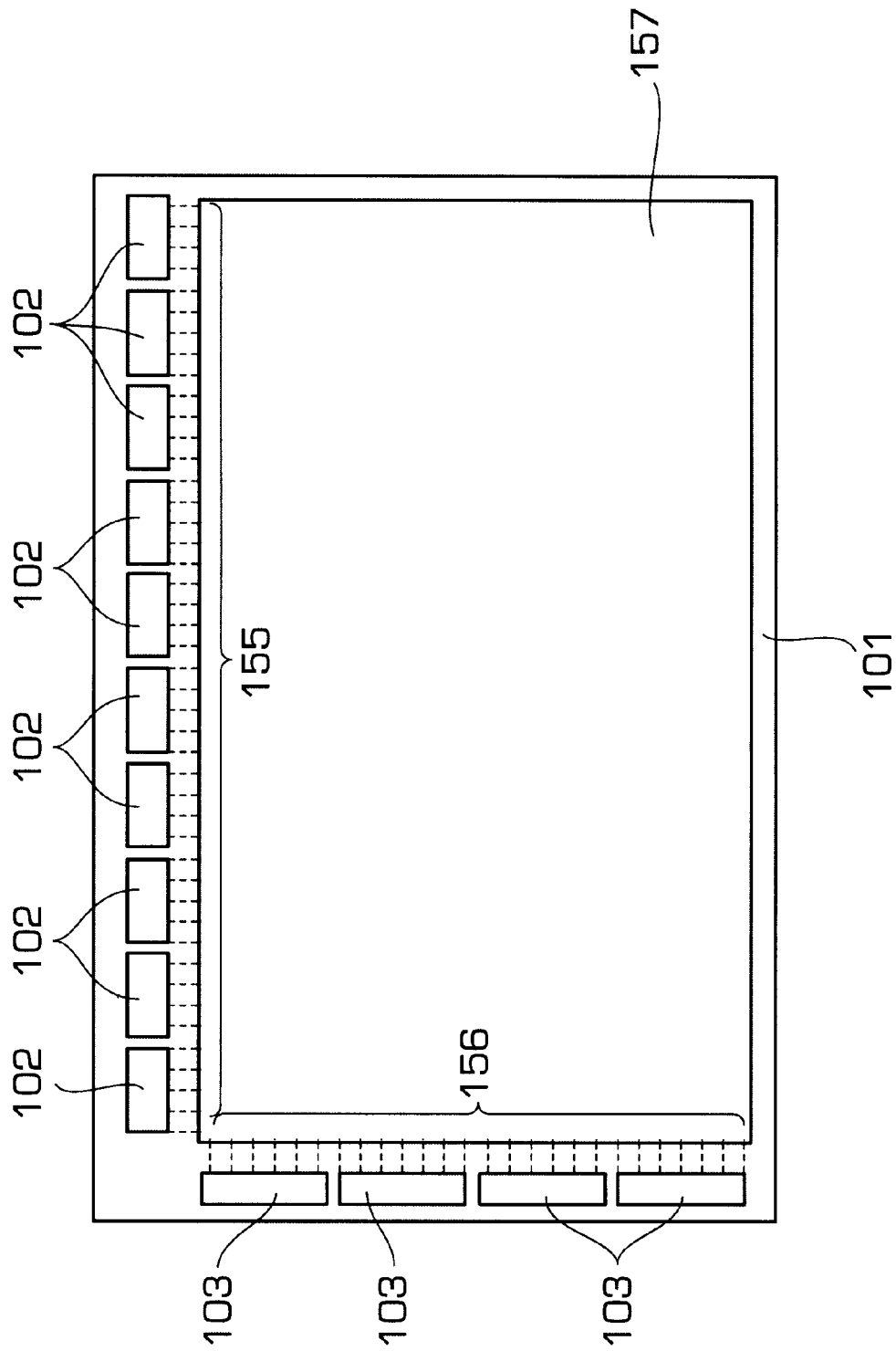
FIG. 1 is a plan view of a conventional display unit.
Figure 2:
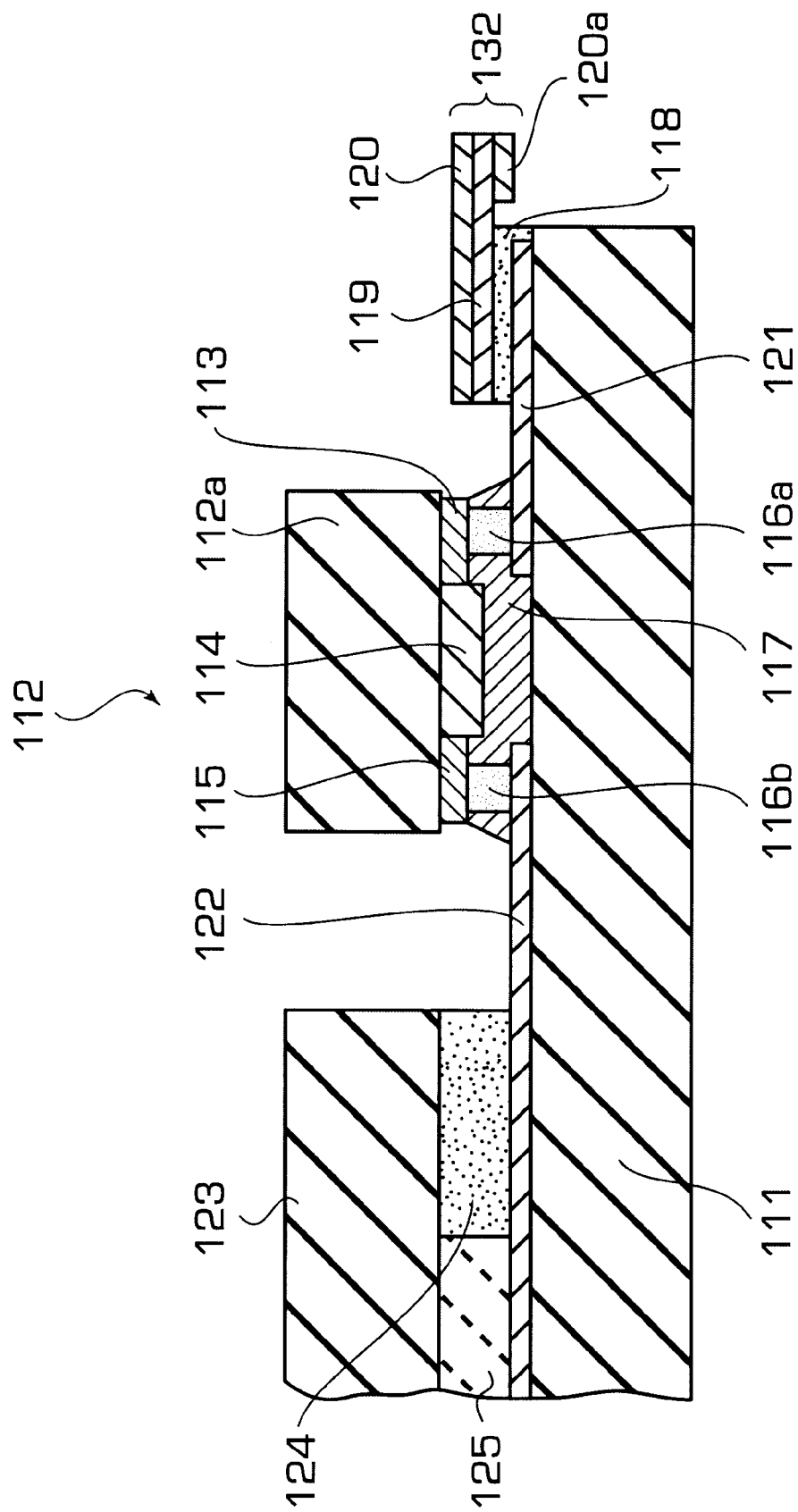
FIG. 2 is a fragmentary cross-sectional view of another conventional display unit.
Figure 3:
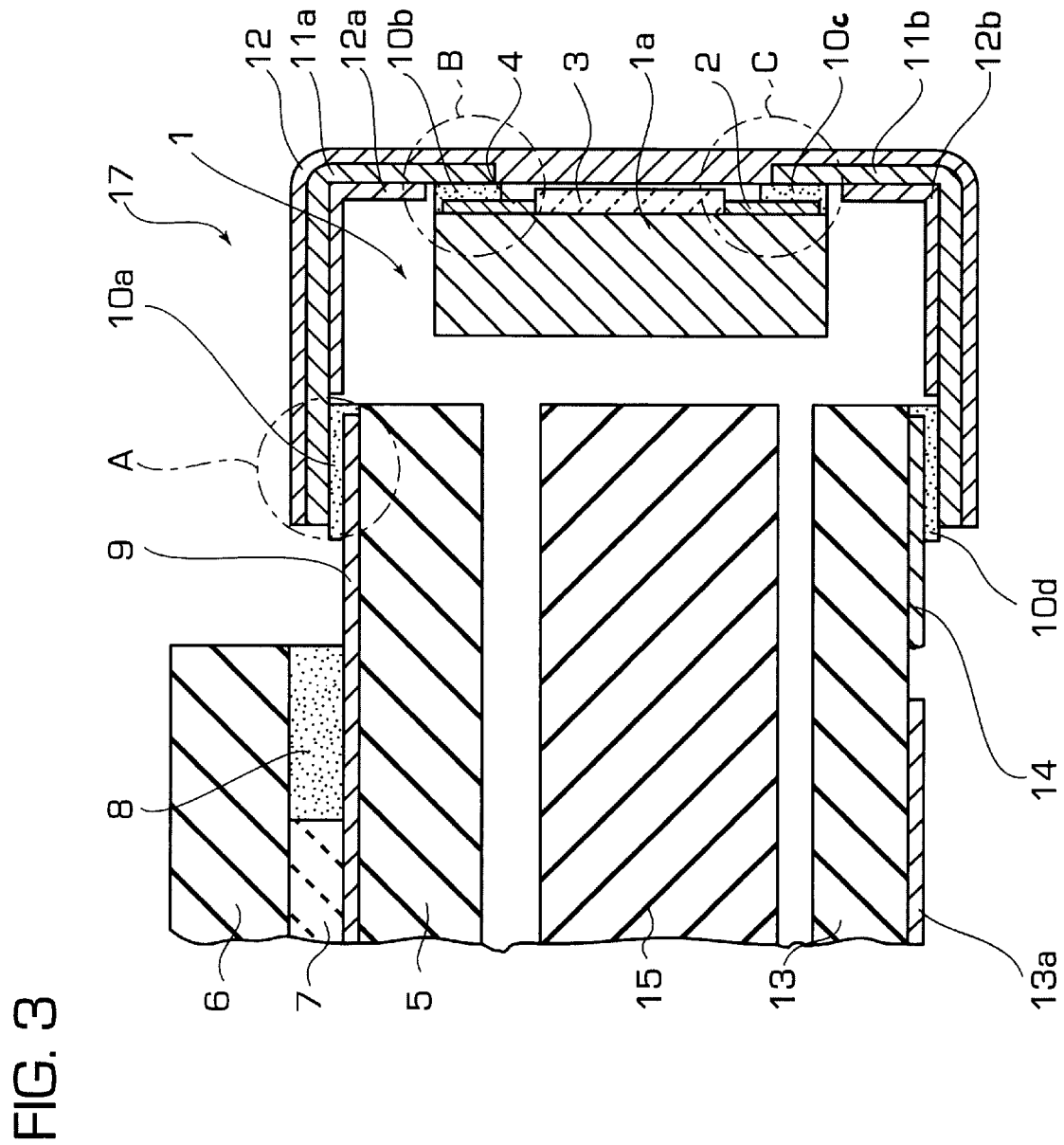
FIG. 3 is a fragmentary cross-sectional view of a display unit according to a first embodiment of the present invention.

1st Embodiment:

As shown in FIG. 3, a display unit according to a first embodiment of the present invention has an input electrode 9 disposed on a surface of a liquid crystal display substrate 5 as a flat display substrate. An opposite substrate 6 is bonded by a seal 8 to the surface of the liquid crystal display substrate 5 on which the input electrode 9 is disposed. A liquid crystal 7 is sealed in a space surrounded by the liquid crystal display substrate 5, the opposite substrate 6, and the seal 8. A plurality of scanning lines and a plurality of signal lines are disposed on the surface of the liquid crystal display substrate 5 which faces the opposite substrate 6, as described later on with reference to FIG. 4. The input electrode is electrically connected to each of the scanning lines or the signal lines. A backlight 15 and a signal processing and driver circuit board (hereinafter referred to as a "driver circuit board 13") are successively disposed in the order named on a surface of the liquid crystal display substrate 5 remote from the input electrode 9. An output electrode 14 is disposed on a surface of the driver circuit board 13 remote from the backlight 15. A driver circuit 13a for supplying a power supply voltage and transmitting a control signal to a driver IC 3 (described later on), is disposed on the surface of the driver circuit board 13.

A driver IC glass chip 1 is disposed on sides of the liquid crystal display substrate 5, the backlight 15, and the driver circuit board 13. The driver IC glass chip 1 comprises a driver IC 3 as a peripheral driver circuit, a driver IC output electrode 4, and a driver IC input electrode 2 which are disposed on a glass substrate 1a as a peripheral driver circuit substrate. The driver IC 3 comprises an integrated circuit of polycrystalline silicon thin-film transistors or p-SiTFTs. The driver IC 3 serves to energize the scanning lines or the signal lines on the surface of the liquid crystal display substrate 5.

The driver IC glass chip 1 is connected to the liquid crystal display substrate 5 and the driver circuit board 13 by a flexible printed circuit board 17.

The flexible printed circuit board 17 comprises insulating films 12, 12a, 12b and conductors 11a, 11b. The conductors 11a, 11b are disposed on respective surface portions of the insulating film 12. The insulating film 12a is disposed on a surface portion of the conductor 11a, and the insulating film 12b is disposed on a surface portion of the conductor 11b. Specifically, the conductor 11a extends on the surface portion of the insulating film 12 from the driver IC glass chip 1 to the liquid crystal display substrate 5, and the conductor 11b extends on the surface portion of the insulating film 12 from the driver IC glass chip 1 to the driver circuit board 13. The conductor 11a has an end electrically connected to the input electrode 9 by an anisotropic conductive film 10a, and an opposite end electrically connected to the driver IC output electrode 4 by an anisotropic conductive film 10b. Therefore, the input electrode 9 and the driver IC output electrode 4 are electrically connected to each other by the anisotropic conductive film 10a, the conductor 10a, and the anisotropic conductive film 10b. The insulating film 12a is disposed on the surface portion of the conductor 11a remote from the insulating film 12, except surface portions where the conductor 11a is electrically connected to the input electrode 9 and the driver IC output electrode 4.

The conductor 11b has an end electrically connected to the driver IC input electrode 4 by an anisotropic conductive film 10c, and an opposite end electrically connected to the output electrode 14 by an anisotropic conductive film 10d. Therefore, the driver IC input electrode 2 and the output electrode 14 are electrically connected to each other by the anisotropic conductive film 10c, the conductor 10b, and the anisotropic conductive film 10d. The insulating film 12b is disposed on the surface portion of the conductor 11b remote from the insulating film 12, except surface portions where the conductor 11b is electrically connected to the driver IC input electrode 2 and the output electrode 14. Consequently, the input electrode 9 is electrically connected to the driver IC output electrode 4 and the driver IC input electrode 2 is electrically connected to the output electrode 14, by the single flexible printed circuit board 17. This structure serves to press and bond regions A, B, C simultaneously, as described later on.

A surface of the driver IC glass chip 1 closer to the driver IC 3 faces the flexible printed circuit board 17, so that the driver IC glass chip 1 is mounted on the flexible printed circuit board 17 by face down bonding. The driver IC input electrode 2 and the driver IC output electrode 4 are made of Al (aluminum) of which the driver IC 3 is made, or ITO, and no bumps are formed on the driver IC input electrode 2 and the driver IC output electrode 4. If the driver IC input electrode 2 and the driver IC output electrode 4 are made of Al, then since a natural oxide film tends to be formed on the surfaces of these electrodes, the anisotropic conductive films 10b, 10c are made of a material containing metal beads. The anisotropic conductive films 10b, 10c which contain metal beads allow the electrodes 2, 4 and the conductors 11a, 11b to be electrically connected while breaking the oxide films on surfaces of these electrodes 2, 4.

If the driver IC input electrode 2 and the driver IC output electrode 4 have surfaces made of ITO, then the anisotropic conductive films 10b, 10c may be made of a material containing plastic beads. With such a material, the electrodes 2, 4 and the conductors 11a, 11b can electrically be connected with a high yield.

In the first embodiment, the sides of the liquid crystal display substrate 5, the backlight 15, and the driver circuit board 13 serve as a side of the display. unit, and the driver IC glass chip 1 is disposed on the side of the display unit. Because the driver IC glass chip 1 is disposed on the side of the display unit, the display unit can have a narrow outer frame and a low profile.

In the first embodiment, the display unit has been described as a liquid crystal display unit. However, the principles of the first embodiment are also applicable to a display unit comprising a plasma display panel.

FIG. 4 shows in fragmentary plan the display unit shown in FIG. 3, with parts being shown exploded. As shown in FIG. 4, a plurality of data bus lines 55 as signal lines and a plurality of gate bus lines 56 as scanning lines perpendicular to the data bus lines 55 are disposed on the liquid crystal display substrate 5 and extend from a display area 57 of the opposite substrate 6. The data bus lines 55 are electrically connected to source driver IC glass chips 51 by flexible printed circuit boards 53a, and the gate bus lines 56 are electrically connected to gate driver IC glass chips 52 by flexible printed circuit boards 53b. The source driver IC glass chips 51 are electrically connected to a driver circuit board 54a by the flexible printed circuit boards 53a, and the gate driver IC glass chips 52 are electrically connected to a driver circuit board 54b by the flexible printed circuit boards 53b.

In this embodiment, one flexible printed circuit board is used in combination with each driver IC glass chip. However, insofar as the accuracy of positional alignment required between the liquid crystal display substrate 5 and the flexible printed circuit boards 53a, 53b permits, one flexible printed circuit board may be used in combination with a plurality of driver IC glass chips. Furthermore, insofar as the accuracy of positional alignment required between the driver IC glass chip 1, the liquid crystal display substrate 5, and the flexible printed circuit board 17 permits, a plurality of flexible printed circuit boards may be used in combination with a single driver IC glass chip. In such a modification, the flexible printed circuit board 17 may be replaced with a flexible printed circuit board which electrically connects the input electrode 9 and the driver IC output electrode 4 to each other and a flexible printed circuit board which electrically connects the driver IC input electrode 2 and the output electrode 14 to each other.

While each of the driver IC glass chips comprises an integrated circuit of p-SiTFTs fabricated on a surface of the glass substrate 1a in the first embodiment, it may comprise other thin-film transistors. For example, each of the driver IC glass chips may comprise an integrated circuit of amorphous silicon thin-film transistors or cadmium-celenide thin-film transistors fabricated on a glass substrate.

In the display unit according to the first embodiment shown in FIGS. 3 and 4, the liquid crystal display substrate 5 and the driver IC glass chips are electrically connected to each other by the flexible printed circuit board. Therefore, it is not necessary to form bumps on the input and output electrodes of the driver IC glass chips unlike the conventional display units. As a result, the display unit may be manufactured inexpensively and with a high yield.

A method of manufacturing the display unit shown in FIGS. 3 and 4 will be described below with reference to FIGS. 5A, 5B, and 5C.

In FIG. 5A, the opposite substrate 6 is joined by the seal 8 to the surface of the liquid crystal display substrate 5 on which the input electrode 9 is disposed. At the same time, the liquid crystal 7 is sealed in the space surrounded by the liquid crystal display substrate 5, the opposite substrate 6, and the seal 8. The liquid crystal display substrate 5 and the opposite substrate 6 which are joined to each other, and the driver IC glass chip 1 with the driver IC 3, the driver IC input electrode 2, and the driver IC output electrode 4 being disposed on one surface thereof are fixed in position at a given distance from each other. At this time, the liquid crystal display substrate 5 and the driver IC glass chip 1 are fixed such that the surface of the liquid crystal display substrate 5 remote from the input electrode 9, and the surface of the driver IC glass chip 1 remote from the driver IC 3 lie flush with each other. If the liquid crystal display substrate 5 has a thickness $d_1$ and the glass substrate 1a of the driver IC glass chip 1 has a thickness $d_2$, then the thicknesses $d_1$, $d_2$ are equal to each other ($d_1=d_2$).

The flexible printed circuit board 17 comprises the insulating film 12, the conductors 11a, 11b, and the insulating films 12a, 12b. The anisotropic conductive film 10a is attached to the surface portion of the conductor 11a which corresponds to the input electrode 9, in an area except for the insulating film 12a, and the anisotropic conductive film 10b is attached to the surface portion of the conductor 11a which corresponds to the driver IC output electrode 4. The anisotropic conductive film 10c is attached to the surface portion of the conductor 11b which corresponds to the driver IC input electrode 2, in an area except for the insulating film 12b, and the anisotropic conductive film 10d is attached to the surface portion of the conductor 11b which corresponds to the output electrode 14 on the driver circuit board 13 (described below with reference to FIG. 5B). Since the anisotropic conductive films 10a, 10b, 10c, 10d are attached to the flexible printed circuit board 17, the flexible printed circuit board 17 can be aligned with the liquid crystal display substrate 5 and the driver IC glass chip 1 highly accurately and efficiently.

If the input electrode 9, the driver IC input electrode 2, and the driver IC output electrode 4 have surfaces made of Al, then the anisotropic conductive films 10a, 10b, 10c, 10d are made of a material containing metal beads. The anisotropic conductive films 10a, 10b, 10c, 10d which contain metal beads allow the electrodes to be electrically connected to the conductors of the flexible printed circuit board 17 while breaking a natural oxide film on the Al surfaces of the electrodes. If the electrodes have surfaces made of ITO, then the anisotropic conductive films 10a, 10b, 10c, 10d are made of a material containing plastic beads.

As shown in FIG. 5B, the anisotropic conductive films 10a, 10b, 10c are brought into contact with the input electrode 9, the driver IC output electrode 4, and the driver IC input electrode 2, respectively, and their contacting surfaces are simultaneously thermally pressed and bonded together. The liquid crystal display substrate 5 and the driver IC glass chip 1 can be simultaneously thermally pressed and bonded to the flexible printed circuit board 17 because the thickness $d_1$ of the liquid crystal display substrate 5 and the thickness $d_2$ of the glass substrate 1a are equal to each other. Thus, the flexible printed circuit board 17 is joined to the liquid crystal display substrate 5 and the driver IC glass chip 1 respectively through the anisotropic conductive films. Thereafter, the output electrode 14 on the driver circuit board 13 is brought into contact with the surface of the insulating film 10d.

Then, as shown in FIG. 5C, the insulating film 10d of the flexible printed circuit board 17 and the output electrode 14 on the driver circuit board 13 are thermally pressed and bonded together. Thereafter, the flexible printed circuit board 17 is bent at the insulating films 12a, 12b. In this manner, the driver IC glass chip 1 is positioned on a side of the display unit, and the liquid crystal display substrate 5 and the driver circuit board 13 lie parallel to each other with the backlight 5 interposed therebetween, as shown in FIG. 3. The display unit shown in FIG. 3 is manufactured through the above steps.

With the above method of manufacturing the display unit according to the first embodiment, the liquid crystal display substrate 5 and the driver IC glass chip 1 can electrically be connected to each other by thermally pressing and bonding the liquid crystal display substrate 5 and the driver IC glass chip 1 to the flexible printed circuit board 17 in one process. Since it is not necessary to form bumps on the electrodes of the driver IC glass chip 1, the manufacturing process is simplified, and the display unit can be manufactured inexpensively and with a high yield.

2nd Embodiment:

A method of manufacturing a display unit according to a second embodiment of the present invention will be described below with reference to FIGS. 6A, 6B, and 6C. The method of manufacturing the display unit according to the second embodiment differs from the method of manufacturing the display unit according to the first embodiment as to the manner in which the flexible printed circuit board and the driver circuit board are connected. The method of manufacturing the display unit according to the second embodiment will be described primarily with respect to details which differ from the method of manufacturing the display unit according to the first embodiment. Those parts shown in FIGS. 6A, 6B, and 6C which are identical to those of the display unit according to the first embodiment are denoted by identical reference characters.

In FIG. 6A, the liquid crystal display substrate 5 and the opposite substrate 6 which are joined to each other, and the driver IC glass chip 1 are fixed in position at a given distance from each other. At this time, the liquid crystal display substrate 5 and the driver IC glass chip 1 are fixed such that the surface of the liquid crystal display substrate 5 remote from the input electrode 9, and the surface of the driver IC glass chip 1 remote from the driver IC 3 lie flush with each other. The thickness $d_1$ of the liquid crystal display substrate 5 and the thickness $d_2$ of the glass substrate 1a of the driver IC glass chip 1 are equal to each other ($d_1 = d_2$).

The driver circuit board 13 is fixed in position on one side of the driver IC glass chip 1 remote from the liquid crystal display substrate 5, and is spaced a given distance from the driver IC glass chip 1. A surface of the driver circuit board 13 remote from the output electrode 14 is held in contact with a surface of a planar height adjustment jig 31, and the driver circuit board 13 is fixed to the height adjustment jig 31. The thickness of the height adjustment jig 31 is adjusted such that a thickness $d_3$, which is the sum of the thickness of the height adjustment jig 31 and the thickness of the driver circuit board 13, is equal to the thickness $d_1$ of the liquid crystal display substrate 5 and also to the thickness $d_2$ of the glass substrate 1a of the driver IC glass chip 1. The driver circuit board 13 and the height adjustment jig 31 are fixed in position such that a surface of the height adjustment jig 31 remote from the driver circuit board 13 and a surface of the driver IC glass chip 1 remote from the driver IC 3 lie flush with each other.

Thereafter, the liquid crystal display substrate 5, the driver IC glass chip 1, and the driver circuit board 13 are joined by the flexible printed circuit board 17 with the anisotropic conductive films 10a, 10b, 10c, 10d attached thereto.

As shown in FIG. 6B, the anisotropic conductive films 10a, 10b, 10c, 10d are brought into contact with the input electrode 9, the driver IC output electrode 4, the driver IC input electrode 2, and the output electrode 14, respectively, and their contacting surfaces are simultaneously thermally pressed and bonded together. The liquid crystal display substrate 5, the driver IC glass chip 1, and the driver circuit board 13 can be simultaneously thermally pressed and bonded to the flexible printed circuit board 17 because the thickness $d_1$ of the liquid crystal display substrate 5, the thickness $d_2$ Of the glass substrate 1a, and the combined thickness $d_3$ of the driver circuit board 13 and the height adjustment jig 31 are equal to each other.

Then, as shown in FIG. 6C, the height adjustment jig 31 held against the surface of the driver circuit board 13 remote from the output electrode 14 is removed. Thereafter, the flexible printed circuit board 17 is bent at the insulating films 12a, 12b. In this manner, the driver IC glass chip 1 is positioned on a side of the display unit, and the liquid crystal display substrate 5 and the driver circuit board 13 lie parallel to each other with the backlight 5 interposed therebetween, as shown in FIG. 3. The display unit similar to the display unit according to the first embodiment is manufactured through the above steps.

With the above method of manufacturing the display unit according to the second embodiment, the liquid crystal display substrate 5 and the driver IC glass chip 1, and the driver IC glass chip 1 and the driver circuit board 13 can electrically be connected to each other by thermally pressing and bonding the liquid crystal display substrate 5, the driver IC glass chip 1, and the driver circuit board 13 to the flexible printed circuit board 17 in one process. Since it is not necessary to form bumps on the electrodes of the driver IC glass chip 1, the manufacturing process is simplified, and the display unit can be manufactured inexpensively and with a high yield.

3rd Embodiment:

A method of manufacturing a display unit according to a third embodiment of the present invention will be described below with reference to FIGS. 7A, 7B, and 7C. The method of manufacturing the display unit according to the third embodiment differs from the method of manufacturing the display unit according to the first embodiment as to a portion of the flexible printed circuit board and the manner in which the flexible printed circuit board and the driver circuit board are connected. The method of manufacturing the display unit according to the third embodiment will be described primarily with respect to details which. differ from the method of manufacturing the display unit according to the first embodiment. Those parts shown in FIGS. 7A, 7B, and 7C which are identical to those of the display unit according to the first embodiment are denoted by identical reference characters.

Figure 7A:
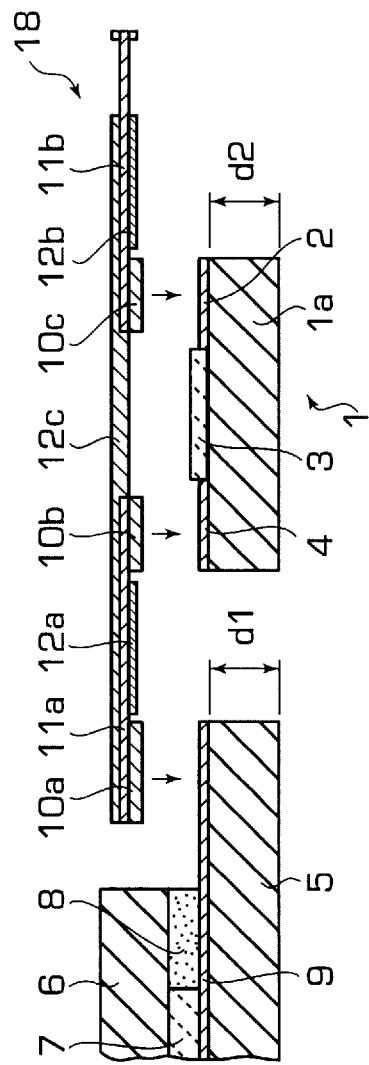
FIGS. 7A, 7B, and 7C are cross-sectional views illustrative of a method of manufacturing a display unit according to a third embodiment of the present invention.

In FIG. 7A, the liquid crystal display substrate 5 and the opposite substrate 6 which are joined to each other, and the driver IC glass chip 1 are fixed in position at a given distance from each other. At this time, the liquid crystal display substrate 5 and the driver IC glass chip 1 are fixed such that the surface of the liquid crystal display substrate 5 remote from the input electrode 9, and the surface of the driver IC glass chip 1 remote from the driver IC 3 lie flush with each other. The thickness $d_1$ of the liquid crystal display substrate 5 and the thickness $d_2$ of the glass substrate 1a of the driver IC glass chip 1 are equal to each other ($d_1 = d_2$).

According to the third embodiment, a flexible printed circuit board 18 differs partly from the flexible printed circuit board 17 according to the first or second embodiment. The input electrode 9 and the driver IC output electrode 4 are electrically connected to each other by the flexible printed circuit board 18, and the driver IC input electrode 2 and the output electrode 14 of the driver circuit board 13, which will be described below with reference to FIGS. 7B and 7C, are electrically connected to each other by the flexible printed circuit board 18. No insulating film and no anisotropic conductive film are disposed on the portion of the conductor 11b to be electrically connected to the output electrode 14, thus exposing the surface of the portion of the conductor 11b near the insulating film 12c and also the surface of the portion of the conductor 11b near the insulating film 12b.

Figure 7B:
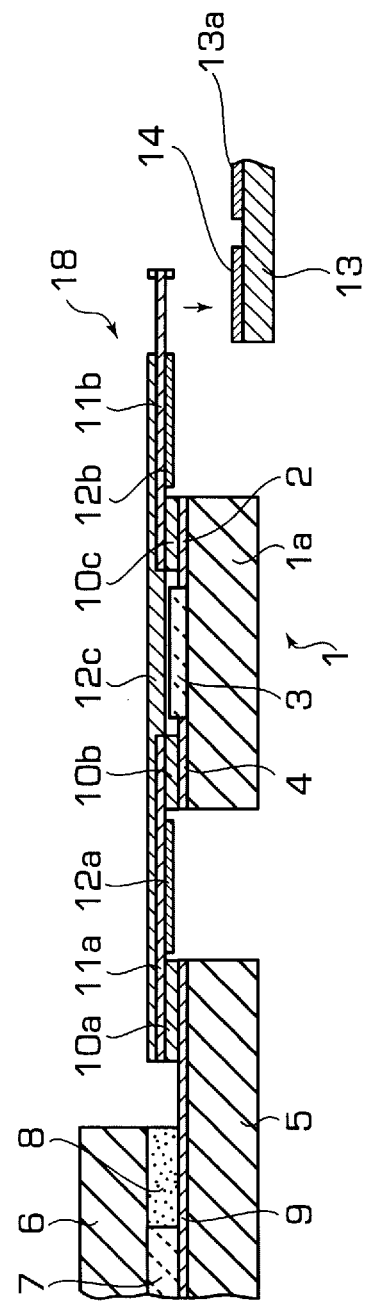

As shown in FIG. 7B, the anisotropic conductive films 10a, 10b, 10c are brought into contact with the input electrode 9, the driver IC output electrode 4, and the driver IC input electrode 2, respectively, and their contacting surfaces are simultaneously thermally pressed and bonded together.

Figure 7C:
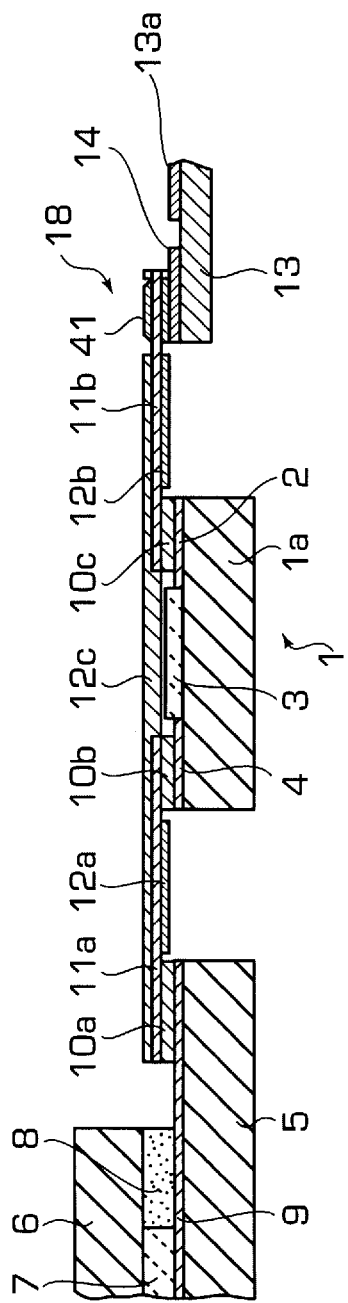

Then, as shown in FIG. 7C, the exposed surface of the conductor 11b near the driver IC glass chip 1 is positioned to confront the surface of the output electrode 14 of the driver circuit board 13, and the output electrode 14 and the conductor 11b are then electrically connected to each other by a solder 41. The bonding with the solder 41 is better with respect to bonding strength than the electrical connection using an anisotropic conductive film, thereby improving the reliability of the display unit. As with the display unit shown in FIG. 3, the liquid crystal display substrate 5 and the driver IC glass chip 1 are electrically connected to each other by the flexible printed circuit board 18, and the driver IC glass chip 1 and the driver circuit board 13 are electrically connected to each other by the flexible printed circuit board 18.

Subsequently, the flexible printed circuit board 18 is bent at the insulating films 12a, 12b. In this manner, the driver IC glass chip 1 is positioned on a side of the display unit, and the liquid crystal display substrate 5 and the driver circuit board 13 lie parallel to each other with the backlight S interposed therebetween, as shown in FIG. 3. The display unit with the driver IC glass chip 1 positioned on a side of the display unit is manufactured through the above steps.

With the above method of manufacturing the display unit according to the third embodiment, the liquid crystal display substrate 5 and the driver IC glass chip 1 can electrically be connected to each other by thermally pressing and bonding the liquid crystal display substrate 5 and the driver IC glass chip 1 to the flexible printed circuit board 17 in one process. Since it is not necessary to form bumps on the electrodes of the driver IC glass chip 1, the manufacturing process is simplified, and the display unit can be manufactured inexpensively and with a high yield.

Figure 8:
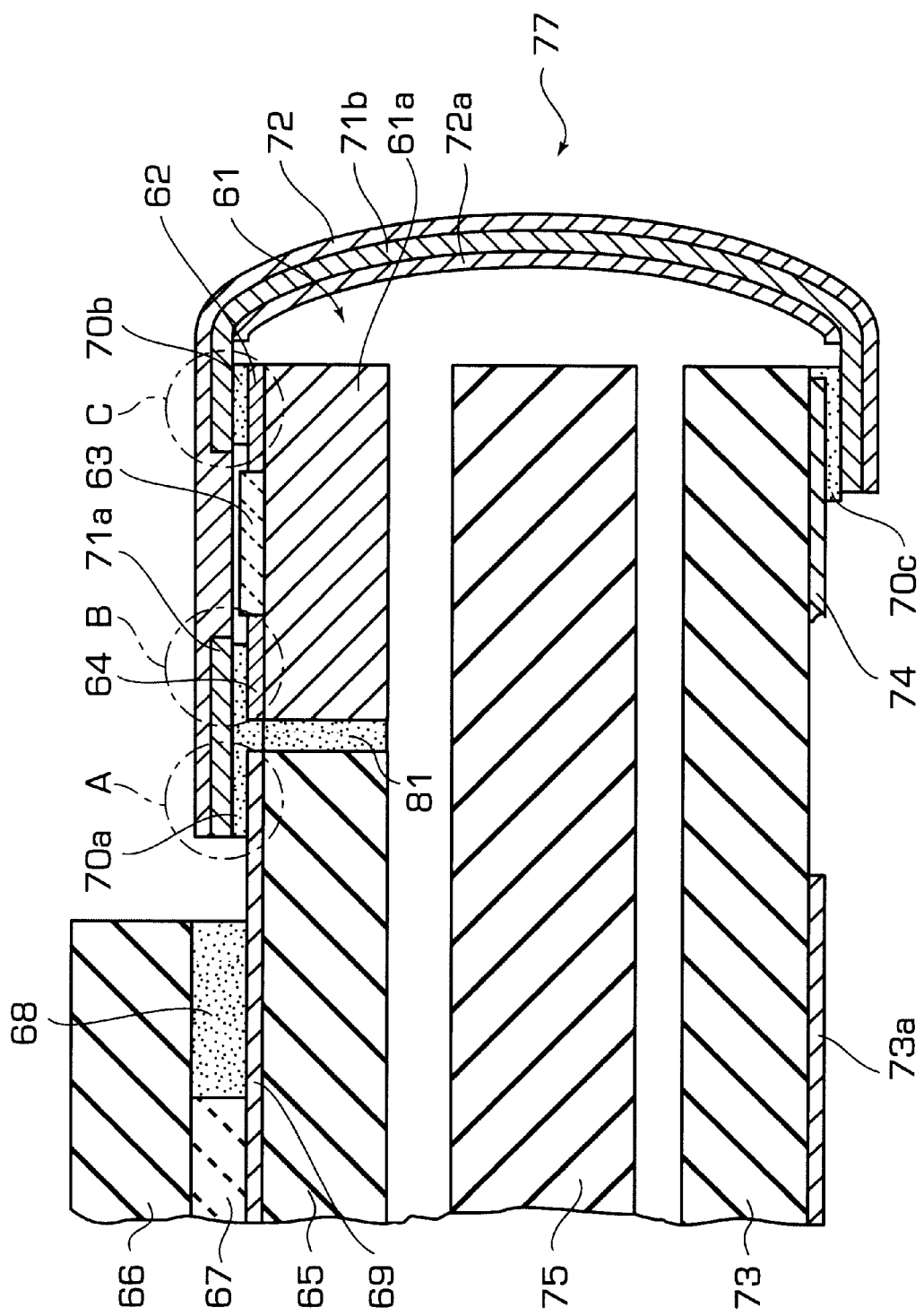
FIG. 8 is a fragmentary cross-sectional view of a display unit according to a fourth embodiment of the present invention.

4th Embodiment:

As shown in FIG. 8, a display unit according to a fourth embodiment of the present invention has an input electrode 69 disposed on a surface of a liquid crystal display substrate 65 as a flat display substrate. An opposite substrate 66 is bonded by a seal 68 to the surface of the liquid crystal display substrate 65 on which the input electrode 69 is disposed. A liquid crystal 67 is sealed in a space surrounded by the liquid crystal display substrate 65, the opposite substrate 66, and the seal 68. A plurality of scanning lines and a plurality of signal lines perpendicular to the scanning lines are disposed on the surface of the liquid crystal display substrate 65 which faces the opposite substrate 66, as with the display units according to the first, second, and third embodiments. The input electrode 69 is used as an input electrode of each of the scanning lines or the signal lines.

A driver IC glass chip 61 comprises a driver IC 63 as a peripheral driver circuit, a driver IC input electrode 62 and a driver IC output electrode 64 which are electrically connected to the driver IC 63. The driver IC 63, the driver IC input electrode 62, and the driver IC output electrode 64 are disposed on a surface of a glass substrate 61a as a peripheral driver circuit substrate. A side of the glass substrate 61a near the driver IC output electrode 64 is bonded by an adhesive 81 to a side of the liquid crystal display substrate 65. A surface of the glass substrate 61a which faces the driver IC 63 lies flush with the surface of the liquid crystal display substrate 65 which faces the input electrode 69.

A backlight 75 and a signal processing and driver circuit board (hereinafter referred to as a "driver circuit board 73") are successively disposed parallel to each other in the order named on surfaces of the liquid crystal display substrate 65 and the driver IC glass chip 61 remote from the opposite electrode 66 and the driver IC 63. An output electrode 74 is disposed on a surface of the driver circuit board 73 remote from the backlight 75. A driver circuit 73a for supplying a power supply voltage and transmitting a control signal to the driver IC 63, is disposed on the driver circuit board 73.

The driver IC glass chip 61 comprises an integrated circuit of p-SiTFTs on a surface of the glass substrate 61a. The driver IC glass chip 61 is connected to the input electrode 69 of the liquid crystal display substrate 65 and the output electrode 74 of the driver circuit board 73 by a flexible printed circuit board 77.

The flexible printed circuit board 77 comprises an insulating film 72, conductors 71a, 71b disposed on respective surface portions of the insulating film 72, and an insulating film 72a disposed on a surface portion of the conductor 71b. The conductor 71a is disposed on the surface portion of the insulating film 72 which faces the input electrode 69 and the driver IC output electrode 64. The conductor 71b extends on a surface of the insulating film 12 from the driver IC input electrode 62 to the output electrode 74.

The conductor 71a is electrically connected to the input electrode 69 and the driver IC output electrode 64 by an anisotropic conductive film 70a. Therefore, the input electrode 69 and the driver IC output electrode 64 are electrically connected to each other by the anisotropic conductive film 70a and the conductor 71a.

The conductor 71b has an end electrically connected to the driver IC input electrode 62 by an anisotropic conductive film 70b, and an opposite end electrically connected to the output electrode 74 by an anisotropic conductive film 70c. Therefore, the driver IC input electrode 62 and the output electrode 74 are electrically connected to each other by the anisotropic conductive film 70b, the conductor 71b, and the anisotropic conductive film 70c. The insulating film 72a is disposed on the surface portion of the conductor 71b remote from the insulating film 72, except surface portions where the conductor 71b is electrically connected to the driver IC input electrode 62 and the output electrode 74. Consequently, the input electrode 69 is electrically connected to the driver IC output electrode 64 and the driver IC input electrode 62 is electrically connected to the output electrode 74, by the single flexible printed circuit board 77. This structure serves to press and bond regions A, B, C simultaneously, as described later on with reference to FIG. 9B.

A surface of the driver IC glass chip 61 closer to the driver IC 63 faces the flexible printed circuit board 77, so that the driver IC glass chip 61 is mounted on the flexible printed circuit board 77 by face down bonding. The driver IC input electrode 62 and the driver IC output electrode 64 are made of Al (aluminum) of which the driver IC 63 is made, or ITO, and no bumps are formed on the driver IC input electrode 62 and the driver IC output electrode 64. If the driver IC input electrode 62 and the driver IC output electrode 64 are made of Al, then since a natural oxide film tends to be formed on the surfaces of these electrodes, the anisotropic conductive films 70a, 70b are made of a material containing metal beads. The anisotropic conductive films 70a, 70b which contain metal beads allow the electrodes 62, 64 and the conductors 71a, 71b to be electrically connected while breaking the oxide films on surfaces of these electrodes 62, 64. If the driver IC input electrode 62 and the driver IC output electrode 64 have surfaces made of ITO, then the anisotropic conductive films 70a, 70b may be made of a material containing plastic beads. With such a material, the electrodes 62, 64 and the conductors 71a, 71b can electrically be connected with a high yield.

In the first embodiment, as shown in FIG. 3, the driver IC glass chip 1 is disposed on a side of the display unit. In the fourth embodiment, the driver IC glass chip 61 is bonded to a side of the liquid crystal display substrate 65. This arrangement permits the driver IC glass chip 61 to be mounted on the display unit without increasing the thickness of the display unit.

In the fourth embodiment, the input electrode 69 is electrically connected to the driver IC output electrode 64 and the driver IC input electrode 62 is electrically connected to the output electrode 74, by the single flexible printed circuit board 77. However, insofar as the accuracy of positional alignment required between the liquid crystal display substrate 65, the liquid crystal display substrate 65, and the flexible printed circuit board 77 permits, the flexible printed circuit board 77 may be replaced with a flexible printed circuit board which electrically connects the input electrode 69 and the driver IC output electrode 64 to each other and a flexible printed circuit board which electrically connects the driver IC input electrode 62 and the output electrode 74 to each other.

In the fourth embodiment, the display unit has been described as a liquid crystal display unit. However, the principles of the fourth embodiment are also applicable to a display unit comprising a plasma display panel.

While the driver IC glass chip comprises an integrated circuit of p-SiTFTs fabricated on a surface of the glass substrate in the fourth embodiment, it may comprise other thin-film transistors. For example, the driver IC glass chip may comprise an integrated circuit of amorphous silicon thin-film transistors or cadmium-celenide thin-film transistors fabricated on a glass substrate.

In the display unit according to the fourth embodiment, the liquid crystal display substrate and the driver IC glass chip are electrically connected to each other by the flexible printed circuit board, without the need for bumps on the input and output electrodes of the driver IC glass chip unlike the conventional display units. As a result, the display unit may be manufactured inexpensively and with a high yield.

A method of manufacturing the display unit shown in FIG. 8 will be described below with reference to FIGS. 9A, 9B, 9C, and 9D.

In FIG. 9A, the opposite substrate 66 is joined by the seal 68 to the surface of the liquid crystal display substrate 65 on which the input electrode 69 is disposed. At the same time, the liquid crystal 67 is sealed in the space surrounded by the liquid crystal display substrate 65, the opposite substrate 66, and the seal 68. The driver IC 63, the driver IC input electrode 62, and the driver IC output electrode 64 are formed on one surface of the glass substrate 61a, producing the driver IC glass chip 61. If the glass substrate 61a of the driver IC glass chip 61 has a thickness $d_4$, and the liquid crystal display substrate 65 has a thickness $d_5$, then the thicknesses $d_4$, $d_5$ are equal to each other ($d_4=d_5$).

In FIG. 9B, a side of the driver IC glass chip 61 is bonded to a side of the liquid crystal display substrate 65 by an epoxy adhesive 81. At this time, a surface of the liquid crystal display substrate 65 remote from the input electrode 69 and a surface of the driver IC glass chip 61 remote from the driver IC 63 lie flush with each other.

The anisotropic conductive film 70a is attached to the entire surface conductor 71a of the flexible printed circuit board 77 shown in FIG. 8, which has been fabricated in another process. The anisotropic conductive film 70b is attached to a surface portion of the conductor 71b which corresponds to the driver IC input electrode 62. The anisotropic conductive film 70c is attached to a surface portion of the conductor 71b which corresponds to the output electrode 74 that will be described later on with reference to FIG. 9C.

Because the anisotropic conductive films are attached to the conductors of the flexible printed circuit board 77, the liquid crystal display substrate 65 and the driver IC glass chip 61 which are bonded to each other, and the flexible printed circuit board 77 can subsequently be pressed and bonded to each other with increased positional alignment accuracy and efficiency.

In this embodiment, since liquid crystal display substrate 65 and the driver IC glass chip 61 are bonded and fixed to each other, the positional alignment accuracy and efficiency at the time the flexible printed circuit board is mounted. is much better than with the display unit according to the first embodiment shown in FIG. 3. The anisotropic conductive films 70a, 70b, 70c are attached to surface portions which will be brought into contact with the input electrode 69, the driver IC output electrode 64, the driver IC input electrode 62, and the output electrode 74 when the flexible printed circuit board 77 is pressed and bonded.

If surfaces of the input electrode 69, the driver IC output electrode 64, and the driver IC input electrode 62 are made of Al, then the anisotropic conductive films 70a, 70b, 70c are made of a material containing metal beads. The anisotropic conductive films 70a, 70b, 70c which contain metal beads allow the electrodes and the conductors of the flexible printed circuit board 77 to be electrically connected while breaking the oxide films on the surfaces of electrodes. If the surfaces of the electrodes are made of ITO, then anisotropic conductive films 70a, 70b, 70c are made of a material containing plastic beads.

Then, as shown in FIG. 9C, the anisotropic conductive films 70a, 70b are brought into contact with the input electrode 69 and the driver IC output electrode 64, and the driver IC input electrode 62, respectively, and their contacting surfaces are simultaneously thermally pressed and bonded together. The liquid crystal display substrate 65 and the driver IC glass chip 61 can be simultaneously thermally pressed and bonded to the flexible printed circuit board 77 because the thickness $d_4$ of the liquid crystal display substrate 65 and the thickness $d_5$ of the glass substrate 61a are equal to each other. Thus, the flexible printed circuit board 77 is joined to the liquid crystal display substrate 65 and the driver IC glass chip 61. Thereafter, the output electrode 74 on the surface of the driver circuit board 73 is brought into contact with the surface of the anisotropic conductive film 70c.

Then, as shown in FIG. 9D, the output electrode 74 of the driver circuit board 73 and the conductor 71b of the flexible printed circuit board 77 are pressed and bonded to each other through the anisotropic conductive film 70c. Therefore, the output electrode 74 and the conductor 71b are electrically connected to each other by the anisotropic conductive film 70c. Thereafter, the flexible printed circuit board 77 is bent at opposite ends of the insulating film 72a, so that the liquid crystal display substrate 65 and the driver circuit board 73 lie parallel to each other with the backlight 75 interposed therebetween, as shown in FIG. 8. The display unit is manufactured through the process of the above steps.

With the above method of manufacturing the display unit according to the fourth embodiment, the input electrode 69 and the driver IC output electrode 64 can electrically be connected to each other by thermally pressing and bonding the liquid crystal display substrate 65 and the driver IC glass chip 61 to the flexible printed circuit board 77 in one process. Since it is not necessary to form bumps on the electrodes of the driver IC glass chip 61, the manufacturing process is simplified, and the display unit can be manufactured inexpensively and with a high yield. Furthermore, inasmuch as the liquid crystal display substrate 65 and the driver IC glass chip 61 are bonded to each other before the flexible printed circuit board 77 is joined, the flexible printed circuit board 77 can be joined with increased positional alignment accuracy and efficiency.

5th Embodiment:

A method of manufacturing a display unit according to a fifth embodiment of the present invention will be described below with reference to FIGS. 10A, 10B, 10C, and 10D. The method of manufacturing the display unit according to the fifth embodiment differs from the method of manufacturing the display unit according to the fourth embodiment as to the manner in which the flexible printed circuit board and the driver circuit board are connected. The method of manufacturing the display unit according to the fifth embodiment will be described primarily with respect to details which differ from the method of manufacturing the display unit according to the fourth embodiment. Those parts shown in FIGS. 10A, 10B, 10C, and 10D which are identical to those of the display unit according to the fourth embodiment are denoted by identical reference characters.

In FIG. 10A, the liquid crystal display substrate 65 and the opposite substrate 66 which are joined to each other, and the driver IC glass chip 61 are fabricated. The thickness $d_4$ of the liquid crystal display substrate 65 and the thickness $d_5$ of the glass substrate 61a are equal to each other.

As shown in FIG. 10B, the glass substrate 61a is bonded to a side of the liquid crystal display substrate 65 by the epoxy adhesive 81. At this time, the surface of the liquid crystal display substrate 65 remote from the input electrode 69 and the surface of glass substrate 61a remote from the driver IC 63 lie flush with each other.

A surface of the driver circuit board 73 remote from the output electrode 74 is held in contact with a surface of a planar height adjustment jig 82, and the driver circuit board 73 is fixed to the height adjustment jig 82. The thickness of the height adjustment jig 82 is adjusted such that a thickness $d_6$, which is the sum of the thickness of the height adjustment jig 82 and the thickness of the driver circuit board 73, is equal to the thickness $d_4$ of the liquid crystal display substrate 65 and also to the thickness $d_5$ of the glass substrate 61a. The liquid crystal display substrate 65 and the driver IC glass chip 61 which are joined to each other, and the height adjustment jig 82 are fixed to one flat surface at a given distance from each other.

Then, as shown in FIG. 10C, the anisotropic conductive films 70a, 70b, 70c are brought into contact with the input electrode 69 and the driver IC output electrode 64, the driver IC input electrode 62, and the output electrode 74, respectively, and their contacting surfaces are simultaneously thermally pressed and bonded together. The liquid crystal display substrate 65, the driver IC glass chip 61, and the driver circuit board 73 can be simultaneously thermally pressed and bonded to the flexible printed circuit board 77 because the thickness $d_4$ of the liquid crystal display substrate 65, the thickness $d_5$ of the glass substrate 61a, and the combined thickness $d_6$ of the driver circuit board 73 and the height adjustment jig 82 are equal to each other.

Then, as shown in FIG. 10D, the height adjustment jig 82 to which the driver circuit board 73 has been fixed is removed. Thereafter, the flexible printed circuit board 77 is bent at the opposite ends of the insulating film 72a. In this manner, the liquid crystal display substrate 65 and the driver circuit board 73 lie parallel to each other with the backlight 55 interposed therebetween, as shown in FIG. 8. The display unit similar to the display unit according to the fourth embodiment is manufactured through the above steps.

With the above method of manufacturing the display unit according to the fifth embodiment, the liquid crystal display substrate 65, the driver IC glass chip 61, and the driver circuit board 73 can be connected to the flexible printed circuit board 77 in one thermal pressing and bonding process. Since it is not necessary to form bumps on the electrodes of the driver IC glass chip 61, the manufacturing process is simplified, and the display unit can be manufactured inexpensively and with a high yield. Furthermore, inasmuch as the liquid crystal display substrate 65 and the driver IC glass chip 61 are bonded to each other before the flexible printed circuit board 77 is joined, the flexible printed circuit board 77 can be joined with increased positional alignment accuracy and efficiency.

6th Embodiment:

A method of manufacturing a display unit according to a sixth embodiment of the present invention will be described below with reference to FIGS. 11A, 11B, 11C, and 11D. The method of manufacturing the display unit according to the sixth embodiment differs from the method of manufacturing the display unit according to the fourth embodiment as to a portion of the flexible printed circuit board and the manner in which the flexible printed circuit board and the driver circuit board are connected. The method of manufacturing the display unit according to the sixth embodiment will be described primarily with respect to details which differ from the method of manufacturing the display unit according to the fourth embodiment. Those parts shown in FIGS. 11A, 11B, 11C, and 11D which are identical to those of the display unit according to the fourth embodiment are denoted by identical reference characters.

Figure 11A:
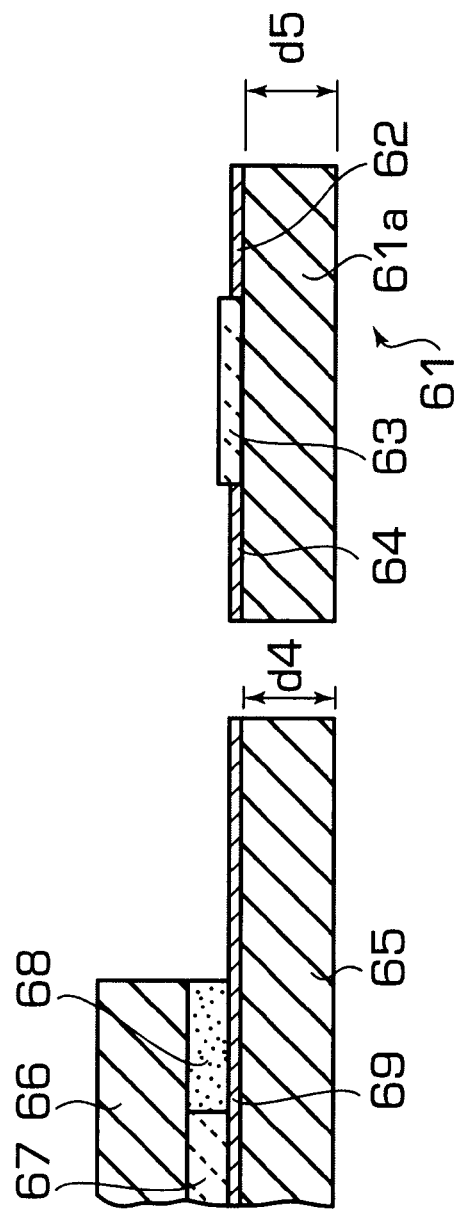
FIGS. 11A, 11B, 11C, and 11D are cross-sectional views illustrative of a method of manufacturing a display unit according to a sixth embodiment of the present invention.

In FIG. 11A, the liquid crystal display substrate 65 and the opposite substrate 66 which are joined to each other, and the driver IC glass chip 61 are fabricated. The thickness $d_4$ of the liquid crystal display substrate 65 and the thickness $d_5$ of the glass substrate 61a are equal to each other.

Figure 11B:
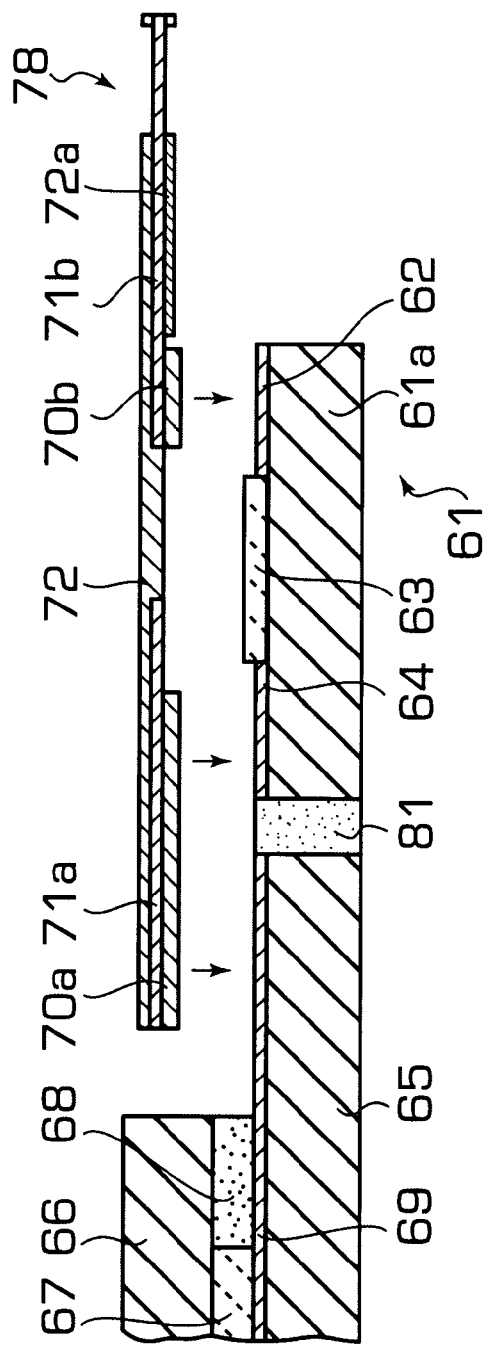

As shown in FIG. 11B, a side of the driver IC glass chip 61 is bonded to a side of the liquid crystal display substrate 65 by the epoxy adhesive 81.

According to the sixth embodiment, a flexible printed circuit board 78 differs partly from the flexible printed circuit board 77 according to the fourth or fifth embodiment. The input electrode 69 and the driver IC output electrode 64 are electrically connected to each other. by the flexible printed circuit board 78, and the driver IC input electrode 62 and the output electrode 74 of the driver circuit board 73, which will be described below with reference to FIGS. 10C and 10D, are electrically connected to each other by the flexible printed circuit board 78. No insulating film and no anisotropic conductive film are disposed on the portion of the conductor 71b to be electrically connected to the output electrode 74, thus exposing the surface of the portion of the conductor 71b near the insulating film 72a and also the surface of the portion of the conductor 71b near the insulating film 72b.

Figure 11C:
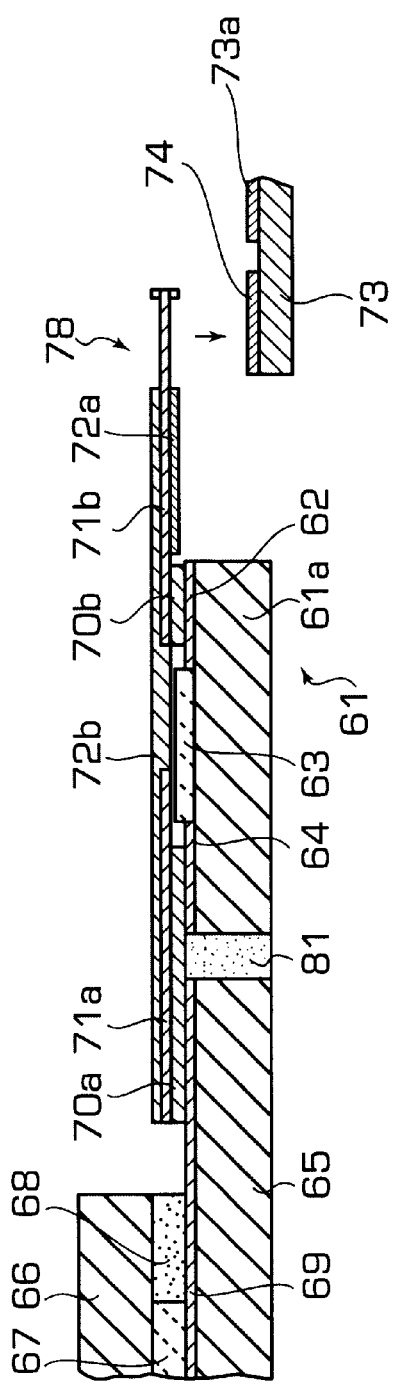

Then, as shown in FIG. 11C, the anisotropic conductive film 70a is brought into contact with the input electrode 69 and the driver IC output electrode 64, and the anisotropic conductive film 70b is brought into contact with the driver IC input electrode 62, and their contacting surfaces are simultaneously thermally pressed and bonded together.

Figure 11D:
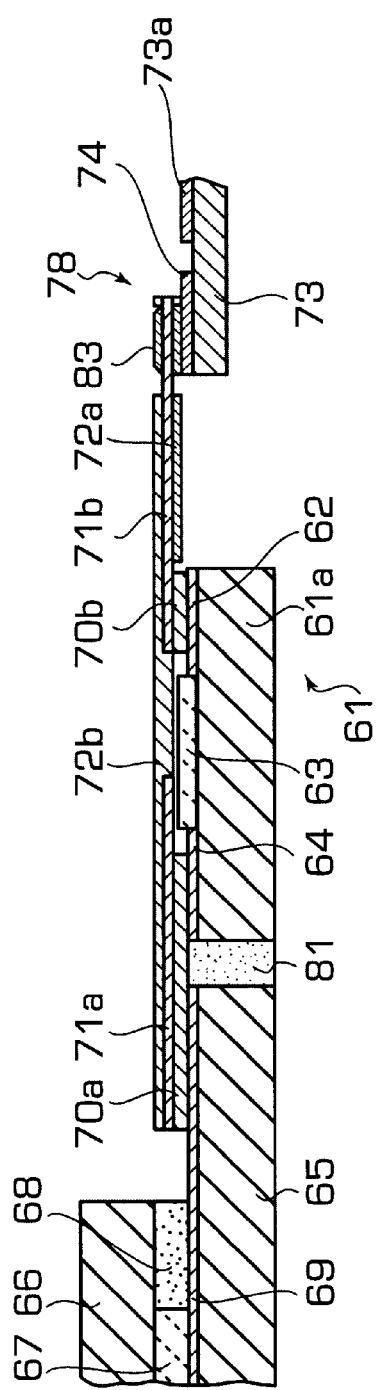

Then, as shown in FIG. 11D, the exposed surface of the conductor 71b near the driver IC glass chip 61 is positioned to confront the surface of the output electrode 74 of the driver circuit board 73, and the output electrode 74 and the conductor 71b are then electrically connected to each other by a solder 83. The bonding with the solder 83 is better with respect to bonding strength than the electrical connection using an anisotropic conductive film, thereby improving the reliability of the display unit. Subsequently, the flexible printed circuit board 78 is bent at opposite ends of the insulating film 72a, so that the liquid crystal display substrate 65 and the driver circuit board 73 lie parallel to each other with the backlight 75 interposed therebetween, as shown in FIG. 8. The display unit is manufactured through the process of the above steps.

With the above method of manufacturing the display unit according to the sixth embodiment, the liquid crystal display substrate 65 and the driver IC output electrode 64 can electrically be connected to each other, and the driver IC input electrode 62 and the output electrode 64 can electrically be connected to each other, by thermally pressing and bonding the liquid crystal display substrate 65 and the driver IC glass chip 61 to the flexible printed circuit board 78 in one process. Since it is not necessary to form bumps on the electrodes of the driver IC glass chip 61, the manufacturing process is simplified, and the display unit can be manufactured inexpensively and with a high yield. Furthermore, inasmuch as the liquid crystal display substrate 65 and the driver IC glass chip 61 are bonded to each other before the flexible printed circuit board 78 is joined, the flexible printed circuit board 78 can be joined with increased positional alignment accuracy and efficiency. Moreover, because the flexible printed circuit board 78 and the driver circuit board 73 are connected to each other by the solder 83, their joined regions have increased bonding strength.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a display unit including a flat display substrate having on a surface thereof a plurality of scanning lines, a plurality of signal lines perpendicular to said scanning lines, and an input electrode connected to each of said scanning lines or said signal lines, a peripheral driver circuit substrate having on a surface thereof a peripheral driver circuit for energizing said scanning lines or said signal lines, and input and output electrodes electrically connected to said peripheral driver circuit, and a driver circuit board having on a surface thereof a driver circuit for supplying a power supply voltage and transmitting a control signal to said peripheral driver circuit on said peripheral driver circuit substrate, and an output electrode electrically connected to said driver circuit, said method comprising the steps of:

simultaneously pressing and bonding said input electrode of each of said scanning lines or said signal lines and said input and output electrodes of said peripheral driver circuit substrate to a flexible printed circuit board thereby to electrically connect said input electrode of said flat display substrate to said output electrode of said driver circuit board through said flexible printed circuit board; and connecting said output electrode of said driver circuit board to said flexible printed circuit board thereby to electrically connect said input electrode of said peripheral driver circuit substrate to said output electrode of said driver circuit board through said flexible printed circuit board.

2. A method according to claim 1, further comprising the step of pressing and bonding said flexible printed circuit board and said output electrode of said driver circuit board to each other thereby to connect said flexible printed circuit board to said output electrode of said driver circuit board.

3. A method according to claim 1, further comprising the step of soldering said flexible printed circuit board and said output electrode of said driver circuit board to each other thereby to connect said flexible printed circuit board to said output electrode of said driver circuit board.

4. A method according to claim 1, further comprising the step of bonding a side of said flat display substrate to a side of said peripheral driver circuit substrate before said input electrode of each of said scanning lines or said signal lines and said input and output electrodes of said peripheral driver circuit substrate are pressed and bonded to said flexible printed circuit board.

5. A method according to claim 1, wherein said flat display substrate and said peripheral driver circuit substrate have respective thicknesses which are equal to each other, further comprising the step of placing said flat display substrate and said peripheral driver circuit substrate in a plane when said input electrode of each of said scanning lines or said signal lines and said input and output electrodes of said peripheral driver circuit substrate are pressed and bonded to said flexible printed circuit board.

6. A method of manufacturing a display unit including a flat display substrate having on a surface thereof a plurality of scanning lines, a plurality of signal lines perpendicular to said scanning lines, and an input electrode connected to each of said scanning lines or said signal lines, a peripheral driver circuit substrate having on a surface thereof a peripheral driver circuit for energizing said scanning lines or said signal lines, and input and output electrodes electrically connected to said peripheral driver circuit, and an insulative driver circuit board having on a surface thereof a driver circuit for supplying a power supply voltage and transmitting a control signal to said peripheral driver circuit on said peripheral driver circuit substrate, and an output electrode electrically connected to said driver circuit, said method comprising the steps of:

simultaneously pressing and bonding said input electrode of each of said scanning lines or said signal lines and said input and output electrodes of said peripheral driver circuit substrate to a flexible printed circuit board thereby to electrically connect said input electrode of said flat display substrate to said output electrode of said insulative driver circuit board through said flexible printed circuit board; and connecting said output electrode of said insulative driver circuit board to said flexible printed circuit board thereby to electrically connect said input electrode of said peripheral driver circuit substrate to said output electrode of said insulative driver circuit board through said flexible printed circuit board.

7. A method according to claim 6, further comprising the step of pressing and bonding said flexible printed circuit board and said output electrode of said insulative driver circuit board to each other thereby to connect said flexible printed circuit board to said output electrode of said insulative driver circuit board.

8. A method according to claim 6, further comprising the step of soldering said flexible printed circuit board and said output electrode of said insulative driver circuit board to each other thereby to connect said flexible printed circuit board to said output electrode of said insulative driver circuit board.

9. A method according to claim 6, further comprising the step of bonding a side of said flat display substrate to a side of said peripheral driver circuit substrate before said input electrode of each of said scanning lines or said signal lines and said input and output electrodes of said peripheral driver circuit substrate are pressed and bonded to said flexible printed circuit board.

10. A method according to claim 6, wherein said flat display substrate and said peripheral driver circuit substrate have respective thicknesses which are equal to each other, further comprising the step of placing said flat display substrate and said peripheral driver circuit substrate in a plane when said input electrode of each of said scanning lines or said signal lines and said input and output electrodes of said peripheral driver circuit substrate are pressed and bonded to said flexible printed circuit board.

11. A method of manufacturing a display unit including a flat display substrate having on a surface thereof a plurality of scanning lines, a plurality of signal lines perpendicular to said scanning lines, and an input electrode connected to each of said scanning lines or said signal lines, a peripheral driver circuit substrate having on a surface thereof a peripheral driver circuit for energizing said scanning lines or said signal lines, and input and output electrodes electrically connected to said peripheral driver circuit, and a driver circuit board having on a surface thereof a driver circuit for supplying a power supply voltage and transmitting a control signal to said peripheral driver circuit on said peripheral driver circuit substrate, and an output electrode electrically connected to said driver circuit, said method comprising the step of:

simultaneously pressing and bonding said input electrode of each of said scanning lines or said signal lines, said input and output electrodes of said peripheral driver circuit substrate, and said output electrode of said driver circuit board to a flexible printed circuit board thereby to electrically connect said input electrode of said flat display substrate to said output electrode of said driver circuit board and electrically connect said input electrode of said peripheral driver circuit substrate to said output electrode of said driver circuit board through said flexible printed circuit board.

12. A method according to claim 11, further comprising the step of bonding a side of said flat display substrate to a side of said peripheral driver circuit substrate before said input electrode of each of said scanning lines or said signal lines, said input and output electrodes of said peripheral driver circuit substrate, and said output electrode of said driver circuit board are simultaneously pressed and bonded to said flexible printed circuit board.

13. A method according to claim 11, wherein said flat display substrate and said peripheral driver circuit substrate have respective thicknesses which are equal to each other, further comprising the step of placing said flat display substrate and said peripheral driver circuit substrate in a plane when said input electrode of each of said scanning lines or said signal lines, and said input and output electrodes of said peripheral driver circuit substrate are simultaneously pressed and bonded to said flexible printed circuit board.

14. A method of manufacturing a display unit including a flat display substrate having on a surface thereof a plurality of scanning lines, a plurality of signal lines perpendicular to said scanning lines, and an input electrode connected to each of said scanning lines or said signal lines, an insulative peripheral driver circuit substrate having on a surface thereof a peripheral driver circuit for energizing said scanning lines or said signal lines, and input and output electrodes electrically connected to said peripheral driver circuit, and a driver circuit board having on a surface thereof a driver circuit for supplying a power supply voltage and transmitting a control signal to said peripheral driver circuit on said insulative peripheral driver circuit substrate, and an output electrode electrically connected to said driver circuit, said method comprising the step of:

simultaneously pressing and bonding said input. electrode of each of said scanning lines or said signal lines, said input and output electrodes of said insulative peripheral driver circuit substrate, and said output electrode of said driver circuit board to a flexible printed circuit board thereby to electrically connect said input electrode of said flat display substrate to said output electrode of said driver circuit board and electrically connect said input electrode of said insulative peripheral driver circuit substrate to said output electrode of said driver circuit board through said flexible printed circuit board.

15. A method according to claim 14, further comprising the step of bonding a side of said flat display substrate to a side of said insulative peripheral driver circuit substrate before said input electrode of each of said scanning lines or said signal lines, said input and output electrodes of said insulative peripheral driver circuit substrate, and said output electrode of said driver circuit board are simultaneously pressed and bonded to said flexible printed circuit board.

16. A method according to claim 14, wherein said flat display substrate and said insulative peripheral driver circuit substrate have respective thicknesses which are equal to each other, further comprising the step of placing said flat display substrate and said insulative peripheral driver circuit substrate in a plane when said input electrode of each of said scanning lines or said signal lines, and said input and output electrodes of said insulative peripheral driver circuit substrate are simultaneously pressed and bonded to said flexible printed circuit board.

\* \* \* \* \*